United States Patent
Umeda et al.

(10) Patent No.: US 10,868,167 B2
(45) Date of Patent: Dec. 15, 2020

(54) SEMICONDUCTOR DEVICE

(71) Applicant: Panasonic Intellectual Property Management Co., Ltd., Osaka (JP)

(72) Inventors: Hidekazu Umeda, Osaka (JP); Kazuhiro Kaibara, Osaka (JP); Satoshi Tamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/873,438

(22) Filed: Jan. 17, 2018

(65) Prior Publication Data

US 2018/0145166 A1 May 24, 2018

Related U.S. Application Data

(63) Continuation of application No. 14/636,149, filed on Mar. 2, 2015, now Pat. No. 9,911,843, which is a
(Continued)

(30) Foreign Application Priority Data

Sep. 12, 2012 (JP) ................... 2012-200613

(51) Int. Cl.
*H01L 29/80* (2006.01)
*H01L 29/78* (2006.01)
(Continued)

(52) U.S. Cl.
CPC .......... *H01L 29/78* (2013.01); *H01L 29/0661* (2013.01); *H01L 29/2003* (2013.01);
(Continued)

(58) Field of Classification Search
None
See application file for complete search history.

(56) References Cited

U.S. PATENT DOCUMENTS

2005/0189561 A1 9/2005 Kinzer et al.
2006/0081985 A1\* 4/2006 Beach ................ H01L 29/0692
257/745
(Continued)

FOREIGN PATENT DOCUMENTS

CN 102292801 A 12/2011
CN 102487080 A 6/2012
(Continued)

OTHER PUBLICATIONS

International Search Report of PCT Application No. PCT/JP2013/004093 dated Jul. 30, 2013.
(Continued)

*Primary Examiner* — Joseph C. Nicely
*Assistant Examiner* — Lamont B Koo
(74) *Attorney, Agent, or Firm* — McDermott Will & Emery LLP

(57) ABSTRACT

A parasitic capacitance and a leak current in a nitride semiconductor device are reduced. For example, a 100 nm-thick buffer layer made of AlN, a 2 μm-thick undoped GaN layer, and 20 nm-thick undoped AlGaN having an Al composition ratio of 20% are epitaxially grown in this order on, for example, a substrate made of silicon, and a source electrode and a drain electrode are formed so as to be in ohmic contact with the undoped AlGaN layer. Further, in the undoped GaN layer and the undoped AlGaN layer immediately below a gate wire, a high resistance region, the resistance of which is increased by, for example, ion implantation with Ar or the like, is formed, and a boundary between the high resistance region and an element region is positioned immediately below the gate wire.

32 Claims, 31 Drawing Sheets

Related U.S. Application Data continuation of application No. PCT/JP2013/004093, filed on Jul. 2, 2013.

(51) Int. Cl.

| | | |
|---|---|---|
| *H01L 29/423* | (2006.01) | |
| *H01L 29/778* | (2006.01) | |
| *H01L 29/20* | (2006.01) | |
| *H01L 29/06* | (2006.01) | |
| *H01L 29/10* | (2006.01) | |
| *H01L 29/417* | (2006.01) | |

(52) U.S. Cl.
CPC .... *H01L 29/4238* (2013.01); *H01L 29/42316* (2013.01); *H01L 29/7786* (2013.01); *H01L 29/06* (2013.01); *H01L 29/10* (2013.01); *H01L 29/1066* (2013.01); *H01L 29/1083* (2013.01); *H01L 29/20* (2013.01); *H01L 29/41758* (2013.01); *H01L 29/4236* (2013.01)

(56) References Cited

U.S. PATENT DOCUMENTS

| | | |
|---|---|---|
| 2006/0252651 A1 | 11/2006 | Asano et al. |
| 2008/0149940 A1 | 6/2008 | Shibata et al. |
| 2011/0272740 A1 | 11/2011 | Umeda et al. |
| 2012/0068227 A1 | 3/2012 | Hikita et al. |
| 2012/0139038 A1 | 6/2012 | Imanishi et al. |
| 2013/0083570 A1 | 4/2013 | Imada |
| 2013/0119486 A1 | 5/2013 | Kaibara et al. |
| 2013/0248876 A1 | 9/2013 | Yaegashi et al. |
| 2013/0341682 A1 | 12/2013 | Umeda et al. |

FOREIGN PATENT DOCUMENTS

| | | |
|---|---|---|
| JP | H04-343440 A | 11/1992 |
| JP | 2006-310512 A | 11/2006 |
| JP | 2012-023074 A | 2/2012 |
| JP | 2012-064900 A | 3/2012 |
| WO | 2010/084727 A1 | 7/2010 |
| WO | 2011/024440 A1 | 3/2011 |
| WO | 2012/063529 A1 | 5/2012 |
| WO | 2012/114393 A1 | 8/2012 |

OTHER PUBLICATIONS

English Translation of Chinese Search Report dated Nov. 30, 2016, for the related Chinese Patent Application No. 201380047535.8.

\* cited by examiner

SEMICONDUCTOR DEVICE

RELATED APPLICATIONS

This application is a continuation of U.S. patent application Ser. No. 14/636,149, filed Mar. 2, 2015, which is a continuation of International Application No. PCT/JP2013/004093, filed Jul. 2, 2013, which claims the benefit of priority to Japanese Application No. 2012-200613, filed on Sep. 12, 2013, the disclosures of which are incorporated by reference herein in their entirety.

TECHNICAL FIELD

The present invention relates to a semiconductor device including a nitride semiconductor, which can be applied to a power switching element that is used in, for example, a power supply circuit of consumer equipment.

BACKGROUND ART

Group III nitride semiconductors typified by gallium nitride (GaN) are wide-gap semiconductors. For example, the forbidden band gaps of gallium nitride (GaN) and aluminum nitride (AlN) are as large as 3.4 eV and 6.2 eV, respectively, at room temperature. Such nitride semiconductors are characterized by having a large breakdown electric field and a higher electron saturation speed than a compound semiconductor such as gallium arsenide (GaAs), silicon (Si), and the like. Then, field effect transistors (FET) using a GaN-based compound semiconductor material have been actively researched and developed as high frequency electronic devices or high power electronic devices.

A nitride semiconductor material such as GaN forms various mixed crystals with AlN or indium nitride (InN), and is therefore capable of forming a heterojunction similar to a conventional arsenic-based semiconductor material such as GaAs. A heterojunction of a nitride semiconductor, for example, an AlGaN/GaN heterostructure is characterized in that a high-concentration and high-mobility carrier is generated at an interface of the heterojunction due to spontaneous polarization and piezoelectric polarization even when the semiconductor is undoped with an impurity. Thus, when a transistor is prepared using a nitride semiconductor, high speed operation can be performed.

Here, AlGaN represents $Al_xGa_{1-x}N$ wherein x satisfies $0<x<1$; InGaN represents $In_yGa_{1-y}N$ wherein y satisfies $0<y<1$; AlInN represents $Al_zIn_{1-z}N$ wherein z satisfies $0<z<1$; InAlGaN represents $In_yAl_xGa_{1-x-y}N$ wherein x and y satisfy $0<x<1$, $0<y<1$ and $0<x+y<1$. These notations also apply hereinafter.

As a semiconductor device including a nitride semiconductor, in which a gate electrode is formed in a finger shape, i.e., a nitride semiconductor device, one described in Patent Literature 1 has been previously known.

CITATION LIST

Patent Literature

PTL 1: Unexamined Japanese Patent Publication No. 2012-023074

SUMMARY OF THE INVENTION

The nitride semiconductor device described in Patent Literature 1 includes a conductive nitride semiconductor layer immediately below electrode wiring, and therefore has the following problem: a parasitic capacitance associated with electrode wiring is generated, and a leak current is generated between a source electrode and a drain electrode, and a gate electrode.

An object to be achieved by the present invention is to reduce a parasitic capacitance and a leak current in a nitride semiconductor device.

For achieving the above-mentioned object, a semiconductor device of the present invention includes: a substrate; a nitride semiconductor layer formed on the substrate; a source electrode, a drain electrode and a gate electrode each formed on the nitride semiconductor layer; and a gate wire layer formed on the nitride semiconductor layer and connected to the gate electrode, wherein the nitride semiconductor layer includes a high resistance region immediately below the gate wire layer and at a distance from an end on the gate electrode side.

According to this configuration, the nitride semiconductor layer includes a high resistance region immediately below the gate wire layer and at a distance from an end on the gate electrode side, and therefore increases in parasitic capacitance and gate current on a periphery of a gate can be suppressed even when the gate wire layer is formed with a large width.

Further, the semiconductor device of the present invention is preferably one wherein the source electrode or the drain electrode is surrounded by the gate electrode and the gate wire layer. According to this preferred configuration, electrons flowing out of the source electrode necessarily pass below the gate electrode or the gate wire layer, so that pinch-off characteristics of the gate are improved.

Further, the semiconductor device of the present invention is preferably one wherein the gate electrode is provided so as to be branched from the wiring layer.

Further, the semiconductor device of the present invention is preferably one including the source electrodes, the drain electrodes and the gate electrodes, wherein each of the gate electrodes is disposed between each of the source electrodes and each of the drain electrodes.

Further, the semiconductor device of the present invention is preferably one wherein each of the source electrodes and each of the drain electrodes are disposed in this order along the gate wire layer.

Further, the semiconductor device of the present invention is preferably one including the wiring layers, wherein the source electrode, the drain electrode and the gate electrode are held between adjacent two of the wiring layers.

Further, the semiconductor device of the present invention is preferably one wherein the source electrode, the drain electrode and the gate electrode are provided on each of both sides of the wiring layer.

Further, the semiconductor device of the present invention is preferably one wherein the high resistance region surrounds the source electrode, the drain electrode and the gate electrode.

Further, the semiconductor device of the present invention is preferably one wherein the source electrode and the drain electrode are disposed with the wiring layer held therebetween.

Further, the semiconductor device of the present invention is preferably one wherein at least one of the source electrode, the drain electrode and the gate electrode is rounded at an end thereof. According to this preferred configuration, the end of the electrode is rounded, so that electric field concentration can be suppressed in a vicinity of the electrode.

Further, the semiconductor device of the present invention is preferably one wherein the high resistance region is rounded at an inner end thereof. According to this preferred configuration, the inner end of the high resistance region is rounded, so that electric field concentration can be suppressed in a vicinity of the high resistance region.

Further, the semiconductor device of the present invention is preferably one wherein a recess is formed on the nitride semiconductor layer immediately below the gate electrode.

Further, the semiconductor device of the present invention is preferably one wherein a recess is formed on the nitride semiconductor layer immediately below the wiring layer and in a vicinity of the high resistance region.

Further, the semiconductor device of the present invention is preferably one wherein the recess surrounds the source electrode or the drain electrode.

Further, the semiconductor device of the present invention is preferably one wherein the recess immediately below the gate electrode is provided so as to be branched from the recess immediately below the wiring layer.

Further, the semiconductor device of the present invention is preferably one wherein an end of the recess is rounded. According to this preferred configuration, the end of the recess is rounded, so that electric field concentration can be suppressed in a vicinity of the end of the recess.

Further, the semiconductor device of the present invention is preferably one wherein the source electrode, the drain electrode and the gate electrode are provided on each of both sides of the wiring layer, and a recess is formed on the nitride semiconductor layer immediately below the wiring layer and in a vicinity of each of both sides of the high resistance region.

Further, the semiconductor device of the present invention is preferably one including a pad formed on the nitride semiconductor layer, wherein the gate wire layer is connected to the pad.

Further, the semiconductor device of the present invention is preferably one including the gate electrodes and the gate wire layers, wherein two of the gate electrodes are held between the source electrode and the drain electrode, and the two gate electrodes held between the source electrode and the drain electrode are connected, respectively, to two different layers of the gate wire layers.

Further, the semiconductor device of the present invention is preferably one wherein one gate electrode and one gate wire layer of the two gate electrodes and the two gate wire layers surround the source electrode, and the other gate electrode and the other gate wire layer surround the drain electrode.

Further, the semiconductor device of the present invention is preferably one wherein the two gate wire layers face each other with the source electrode and the drain electrode held therebetween, the semiconductor device includes the source electrodes and the drain electrodes, and each of the source electrodes and each of the drain electrodes are alternately disposed along the two gate wire layers.

Further, the semiconductor device of the present invention is preferably one wherein a recess is formed on the nitride semiconductor layer immediately below the gate electrode.

Further, the semiconductor device of the present invention is preferably one wherein a p-type semiconductor layer is formed between the gate electrode and the gate wire layer, and the nitride semiconductor layer.

Further, the semiconductor device of the present invention is preferably one wherein the p-type semiconductor layer is formed immediately below the gate electrode, immediately below the wiring layer and in a vicinity of the high resistance region, and the gate electrode and the wiring layer cover the p-type semiconductor layer.

Further, the semiconductor device of the present invention is preferably one wherein an insulating layer is formed between the gate electrode and the gate wire layer, and the nitride semiconductor layer.

Further, the semiconductor device of the present invention is preferably one wherein the high resistance region is formed by ion implantation to the nitride semiconductor layer.

Further, the semiconductor device of the present invention is preferably one wherein the nitride semiconductor layer includes two layers that have different compositions and are in contact with each other, and the high resistance region is formed by etching until reaching an interface between the two layers.

According to the nitride semiconductor according to the present invention, a parasitic capacitance and a leak current in a gate wire can be suppressed while pinch-off characteristics of a transistor are improved.

DESCRIPTION OF EMBODIMENTS

Exemplary embodiments of the present invention will be described with reference to the drawings.

First Exemplary Embodiment

Figure 1:
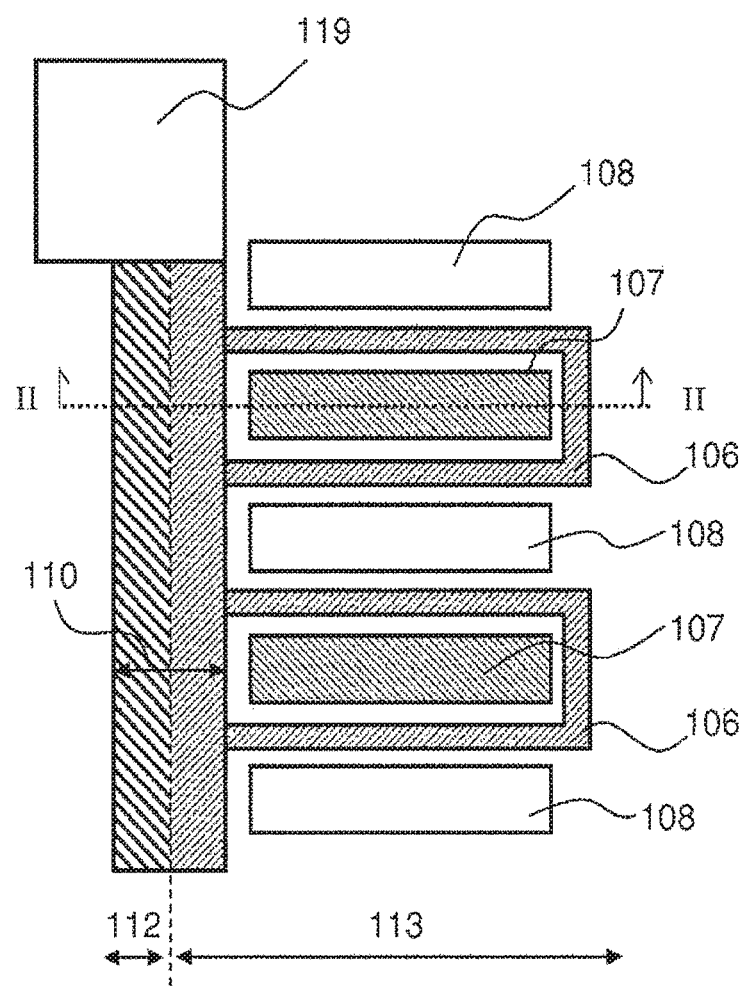
FIG. 1 is a plan view of a nitride semiconductor device according to a first exemplary embodiment of the present invention.

FIG. 1 is a plan view showing a structure of a semiconductor device including a nitride semiconductor, i.e., a nitride semiconductor device according to a first exemplary embodiment of the present invention.

Example 1-1

Figure 2:
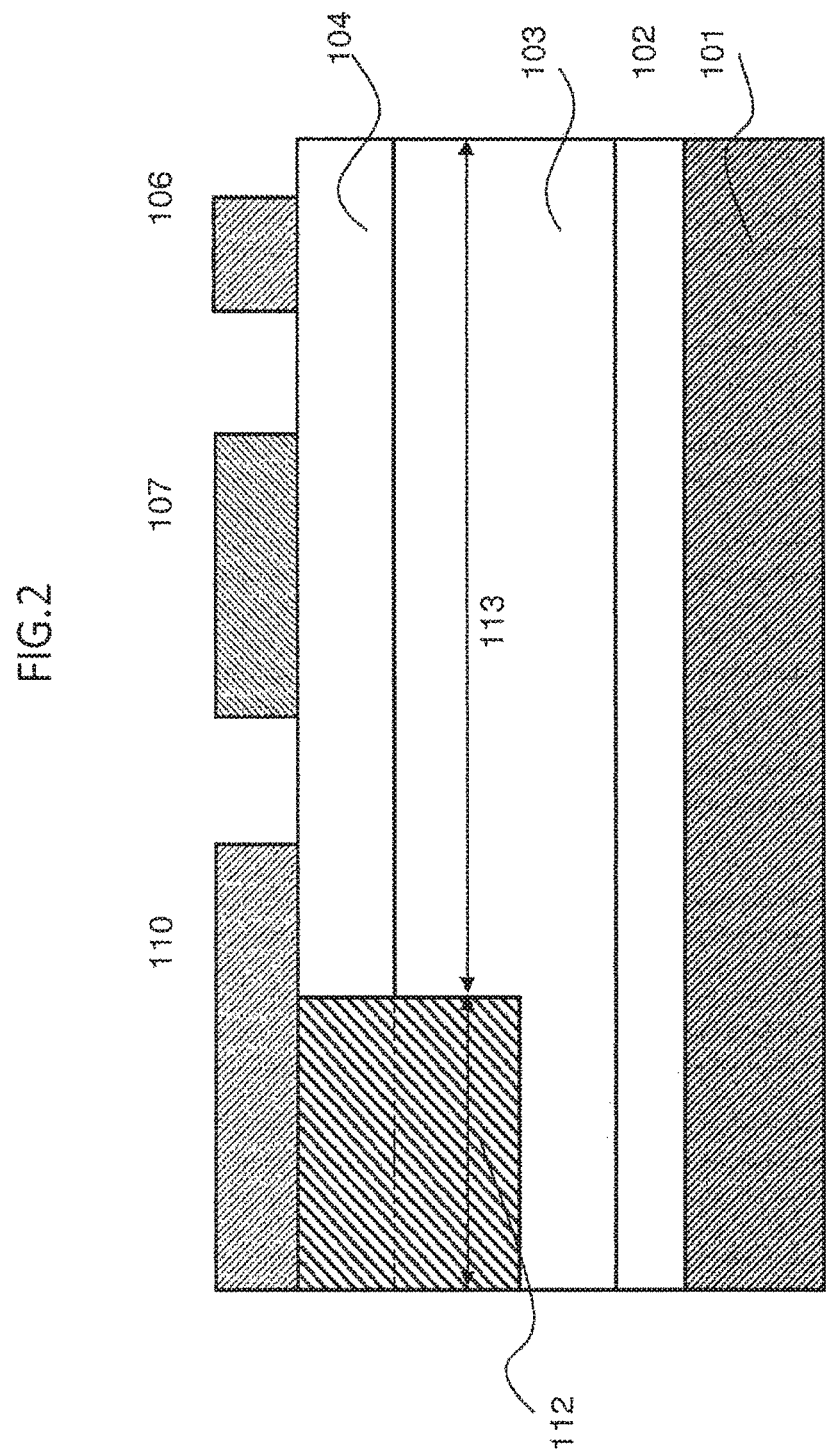
FIG. 2 is a sectional view along dashed line II-II shown in FIG. 1 of a nitride semiconductor device according to Example 1-1 in the first exemplary embodiment of the present invention.

FIG. 2 is a sectional view showing a structure of the nitride semiconductor device along dashed line II-II shown in FIG. 1. In the present application, hatching is appropriately omitted in the sectional view for avoiding complication.

The nitride semiconductor device according to Example 1 of the present exemplary embodiment is configured such that, for example, 100 nm-thick buffer layer 102 made of AlN, 2 μm-thick undoped GaN layer 103, and 20 nm-thick undoped AlGaN layer 104 having an Al composition ratio of 20% are epitaxially grown in this order on, for example, 600 μm-thick substrate 101 made of silicon, and for example, source electrode 107 having a laminated structure of Ti and Al and drain electrode 108 having a laminated structure of Ti and Al are formed so as to be in ohmic contact with undoped AlGaN layer 104. For example, gate electrode 106 made of Ni and gate wire 110 made of Au are formed so as to be in Schottky contact with undoped AlGaN layer 104. Gate wire 110 is electrically connected to gate electrode 106, and formed so as to make an angle of 90° with respect to gate electrode 106, source electrode 107 and drain electrode 108. Gate electrode 106 and gate wire 110 may be made of the same electrode material, or may be formed at the same time. For example, gate electrode 106 and gate wire 110 may be formed using Ni as the electrode material thereof by vapor deposition, sputtering or the like while photolithography is performed at the same time. Source electrode 107 is disposed so as to be surrounded by gate electrode 106 and gate wire 110. Further, in undoped GaN layer 103 and undoped AlGaN layer 104 immediately below gate wire 110, high resistance region 112, the resistance of which is increased by, for example, Ar ion implantation, is formed, and a boundary between high resistance region 112 and element region 113 is positioned immediately below the gate wire. Here, a resistance of high resistance region 112 is a value equal to or greater than a measurement limit value in usual resistance measurement. That is, high resistance region 112 is semi-insulating or insulating.

Parameters of compositions and layer thicknesses of the layers described above are shown in Table 1, and materials of the electrodes are shown in Table 2. In Table 2, for example, Ti/Al shows a laminated structure of Ti and Al.

TABLE 1

| Material | Al composition | Layer thickness |
| --- | --- | --- |
| Silicon substrate 101 | — | 600 μm |
| Buffer layer 102 | 1 | 100 nm |
| Undoped GaN layer 103 | 0 | 2 μm |
| AlGaN layer 104 | 0.2 | 50 nm |

TABLE 2

| Name | Material |
| --- | --- |
| Gate electrode 106 | Ni |
| Source electrode 107 | Ti/Al |
| Drain electrode 108 | Ti/Al |
| Gate wire 110 | Au |
| Gate pad 119 | Au |

Gate pad 119 made of Au is provided at an end of gate wire 110.

Here, a length of each of source electrode 107 and drain electrode 108 along dashed line II-II is 200 μm, and a width (width in a direction perpendicular to dashed line II-II) of each of source electrode 107 and drain electrode 108 is 5 μm. A width of gate electrode 106 is 1.5 μm. A distance between source electrode 107 and gate electrode 106, i.e., an inter-electrode distance is 1.5 μm, and an inter-electrode distance between gate electrode 106 and drain electrode 108 is 10 μm. Here, the inter-electrode distance refers to a distance between ends of two electrodes, which face each other.

Source electrode 107 and drain electrode 108 are provided at a distance of 10 μm from an end of gate wire 110.

A width (width in a direction along dashed line II-II) of gate wire 110 is 40 μm, and high resistance region 112 obtained by ion implantation is formed on gate wire 110 except a region of 2 μm from an end of gate wire 110 on the gate electrode side. In a depth direction (direction perpendicular to the substrate), high resistance region 112 is formed so as to extend from undoped AlGaN layer 104 to an inside of undoped GaN layer 103. For example, in the depth direction, high resistance region 112 is formed so as to extend from a surface of undoped AlGaN layer 104 to a depth of 0.5 μm.

Gate pad 119 is a square having a length of 100 μm on each side.

For source electrode 107 and drain electrode 108, although not illustrated, an insulating layer is formed on gate electrode 106, source electrode 107 and drain electrode 108, the insulating layer is provided with holes (via holes) that reach source electrode 107 and drain electrode 108, respectively, and a source pad connected to source electrode 107 and a drain pad connected to drain electrode 108 are formed through the respective via holes. That is, pad-on-element mounting is performed.

Figure 3:
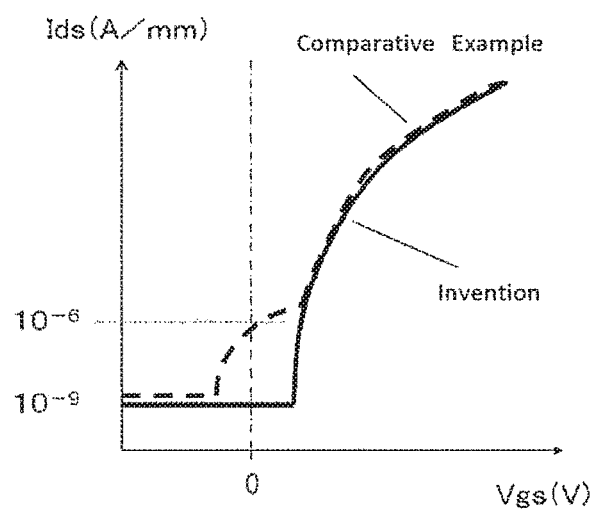
FIG. 3 is a view showing Ids-Vds characteristics of the nitride semiconductor device according to the first exemplary embodiment of the present invention.

In the semiconductor device of the present example, a high-concentration two-dimensional electron gas is formed at an interface between undoped GaN layer 103 and undoped AlGaN layer 104, so that large-current and low-on-resistance operation can be performed. For reducing a gate resistance of a transistor, gate wire 110 has a sufficiently large width of 40 μm. Since high resistance region 112 is formed immediately below gate wire 110, the two-dimensional electron gas immediately below gate wire 110 is inactivated. Consequently, increases in parasitic capacitance and gate current on a periphery of a gate can be suppressed even when gate wire 110 is formed with a large width. Since a boundary between high resistance region 112 and element region 113 is positioned immediately below gate wire 110, electrons flowing out of source electrode 107 necessarily pass under gate electrode 106 formed on element region 113. Consequently, pinch-off characteristics of the gate are improved. For confirmation thereof, a relationship between a gate-source voltage Vgs and a drain-source voltage Ids was examined for the nitride semiconductor device of the present invention according to the present example and a nitride semiconductor device (comparative example) with high resistance region 112 formed by performing Ar ion implantation so as to extend to an outside of gate wire 110 (i.e., high resistance region 112 protruded to the outside of gate wire 110). Results thereof are shown in FIG. 3. The nitride semiconductor device is drain-grounded for both the present invention and comparative example. In FIG. 3, the ordinate represents Ids (unit: A/mm), and the abscissa represents Vgs (unit: V). The value is greater in an arrow direction for the ordinate, and the value is more positive in an arrow direction for the abscissa. The ordinate is a logarithmic graph. The solid line represents a graph for the semiconductor device of the present invention, and the dashed line represents a graph for the semiconductor device of comparative example.

The graph in FIG. 3 shows that Ids is $10^{-6}$ A/mm when Vgs is 0 V for the semiconductor device of comparative example, and Ids is $10^{-9}$ A/mm when Vgs is 0 V for the semiconductor device of the present invention. That is, when Vgs is 0 V, Ids of the semiconductor device of the present invention is greater by a factor of $10^{-3}$ than Ids of the semiconductor device of comparative example, and it has been thus found that the semiconductor device of the present invention is superior in pinch-off characteristics to the semiconductor device of comparative example. This may be because in the present invention, electrons flowing out of source electrode 107 necessarily pass under gate electrode 106 formed on element region 113.

Off-leak currents at a drain voltage of 600 V were compared between the semiconductor device of the present invention and the semiconductor device of comparative example. Results thereof are shown in Table 3. The comparison was made for two cases: a case where a temperature of surrounding of the semiconductor device (ambient temperature) was 25° C. and a case where the ambient temperature was 150° C.

TABLE 3

| | Invention | Comparative Example |
| --- | --- | --- |
| 25° C. | 1.7 μA | 1.6 μA |
| 150° C. | 31 μA | 120 μA |

It was found from the results in Table 3 that when the ambient temperature was 25° C., there was little difference between the semiconductor device of the present invention having an off-leak current of 1.7 μA and the semiconductor device of comparative example having an off-leak current of 1.6 μA, but when the ambient temperature was 150° C., the semiconductor device of the present invention had a smaller off-leak current with the semiconductor device of the present invention having an off-leak current of 31 μA and the semiconductor device of comparative example having an off-leak current of 120 μA. This indicates that the semiconductor device of the present invention has a smaller leak-current particularly in high-temperature operation than the semiconductor device of comparative example. From the above, it is apparent that the semiconductor device of the present invention is useful particularly in power applications.

In the present example, an example has been shown in which source electrode 107 is surrounded by gate electrode 106 and gate wire 110, but drain electrode 108 may be surrounded thereby.

A length of gate electrode 106 along dashed line II-II from the end of gate wire 110 is more preferably 100 nm to 800 μm. The length of the gate electrode being less than 100 μm is not preferred because an area of a wiring portion is relatively large in integration of the transistor. The length of the gate electrode being more than 800 μm is not preferred because a gate resistance increases to adversely affect switching characteristics. When the length of gate electrode 106 is changed, a length of each of source electrode 107 and drain electrode 108 along dashed line II-II may be appropriately changed.

Modification 1-1

Figure 4:
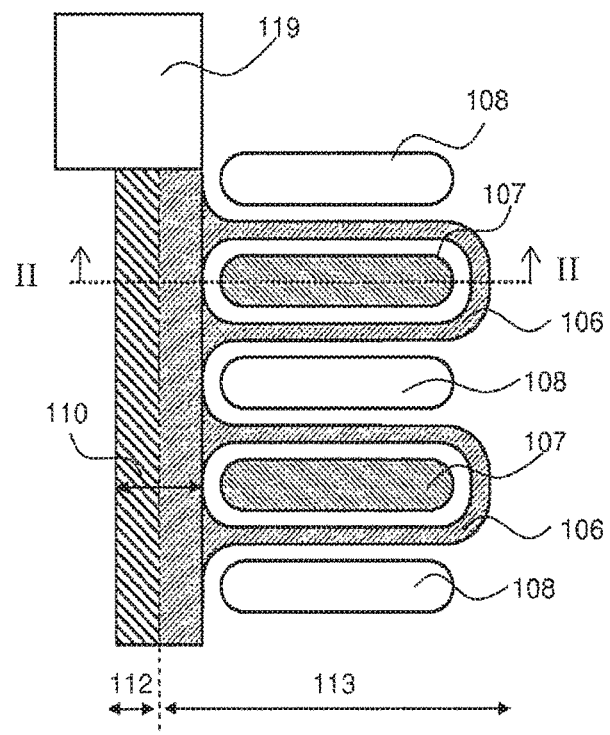
FIG. 4 is a plan view of a nitride semiconductor device according to Modification 1-1 in the first exemplary embodiment of the present invention.

A nitride semiconductor device according to the present modification is obtained by rounding an end of each of gate electrode 106, source electrode 107 and drain electrode 108 in the nitride semiconductor device shown in the plan view of FIG. 1, and a plan view of the nitride semiconductor device according to Modification 1-1 is shown in FIG. 4. Compositions and layer thicknesses of substrate 101 and layers up to and including undoped AlGaN layer 104, and metal compositions, lengths and widths of gate electrode 106, source electrode 107, drain electrode 108, wiring layer 110 and electrode pad 119 are the same as in Example 1. An end of each of gate electrode 106, source electrode 107 and drain electrode 108 is formed in an arc shape. Consequently, electric filed concentration can be suppressed. A sectional view along dashed line II-II in FIG. 4 of this nitride semiconductor device is the same as FIG. 2.

As a result of examining the nitride semiconductor device according to the present modification, it has been found that as shown in FIG. 3, the semiconductor device is superior in pinch-off characteristics to the semiconductor device of comparative example.

Example 1-2

Figure 5:
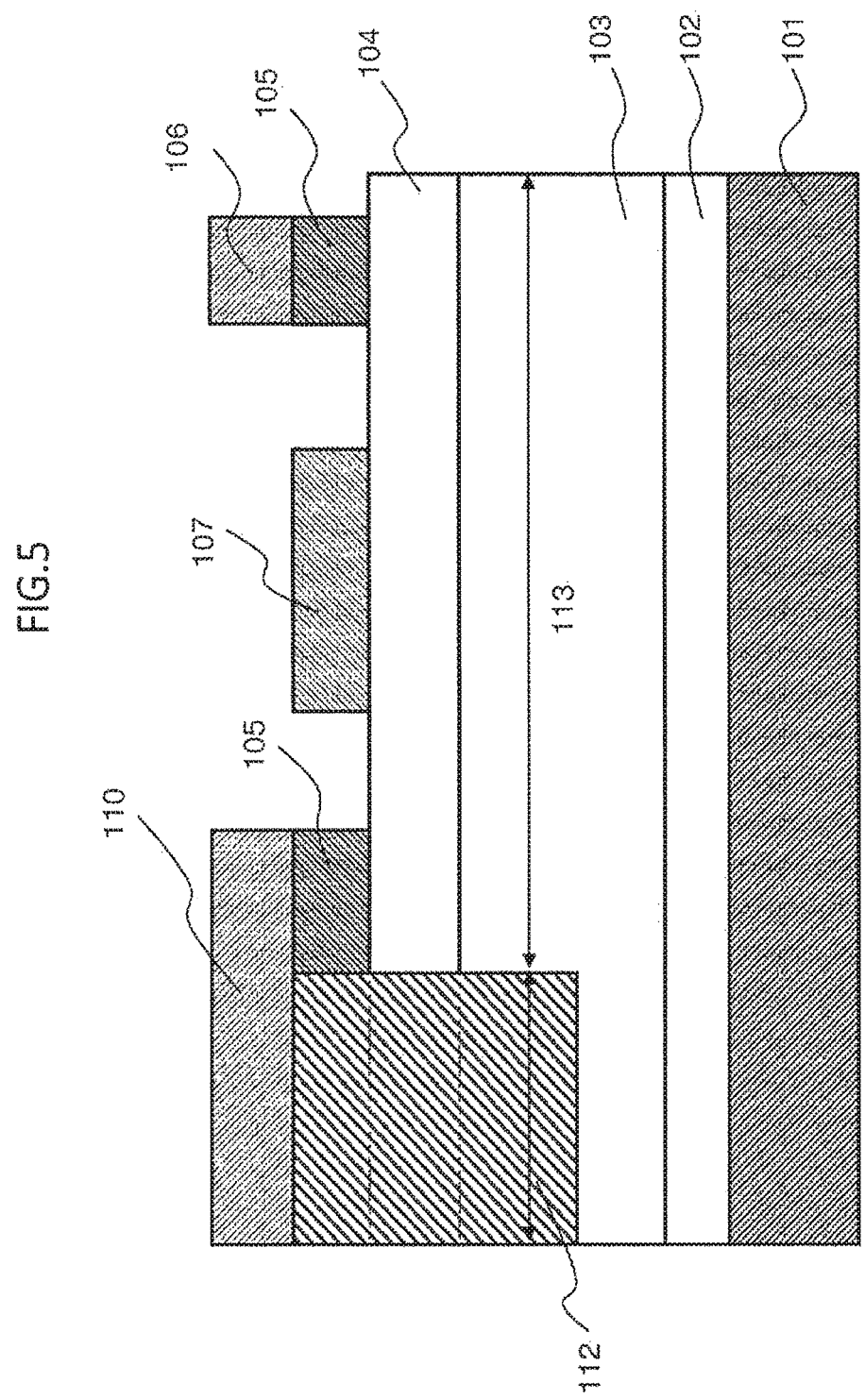
FIG. 5 is a sectional view along dashed line II-II shown in FIG. 1 of a nitride semiconductor device according to Example 1-2 in the first exemplary embodiment of the present invention.

A nitride semiconductor device according to Example 2 of the present invention is the same as that according to Example 1 for the plan view of FIG. 1, and as shown in FIG. 5, the nitride semiconductor device is different from that according to Example 1 only in a cross section structure along dashed line II-II shown in FIG. 1.

As shown in FIG. 5, the nitride semiconductor device according to the present example is configured such that p-type semiconductor layer 105 is formed on undoped AlGaN layer 104, and gate electrode 106 and gate wire 110 are formed so as to be in contact with p-type semiconductor layer 105. As p-type semiconductor layer 105, a Mg-doped p-type GaN layer having a layer thickness of 200 nm is used. Here, gate electrode 106 and gate wire 110 may be in Ohmic contact with p-type semiconductor layer 105, or may be in Schottky contact with p-type semiconductor layer 105. For gate electrode 106 that is in ohmic contact with the p-type semiconductor layer, for example, Ni or Pd is preferably used, and for gate electrode 106 that is in Schottky contact with the p-type semiconductor layer, for example, Ti or W may be used.

Source electrode 107 is disposed so as to be surrounded by gate electrode 106, gate wire 110 and p-type semiconductor layer 105. Further, in undoped GaN layer 103, and undoped AlGaN layer 104 and p-type semiconductor layer 105 immediately below gate wire 110, for example, high resistance region 112, the resistance of which is increased by Ar ion implantation, is formed, and a boundary between high resistance region 112 and element region 113 is positioned immediately below gate wire 110.

Compositions and layer thicknesses of substrate 101 and layers up to and including undoped AlGaN layer 104, metal compositions, lengths and widths of gate electrode 106, source electrode 107, drain electrode 108, wiring layer 110 and electrode pad 119, and positions of high resistance region 112 and element region 113, etc. are the same as the values described in Example 1.

In the semiconductor device of the present example, a high-concentration two-dimensional electron gas is formed at an interface between undoped GaN layer 103 and undoped AlGaN layer 104, so that large-current and low-on-resistance operation can be performed. Due to connection of p-type semiconductor layer 105, a potential at the interface between undoped GaN layer 103 and undoped AlGaN layer 104 increases. Thus, so-called normally-off operation can be performed in which at a gate voltage of 0 V, a two-dimensional electron gas is not generated, and a drain current no longer passes. Consequently, safety of power supply equipment and so on can be secured. For reducing a gate resistance of the transistor, gate wire 110 has a sufficiently large width. Since high resistance region 112 is formed immediately below gate wire 110, the two-dimensional electron gas immediately below gate wire 110 is inactivated. Consequently, increases in parasitic capacitance and gate current on a periphery of a gate can be suppressed even when gate wire 110 is formed with a large width. Since a boundary between high resistance region 112 and element region 113 is positioned immediately below gate wire 110, electrons flowing out of source electrode 107 necessarily pass under gate electrode 106 formed on element region 113, so that pinch-off characteristics of the gate are improved.

In the present example, as the p-type semiconductor layer, a p-type GaN layer is used, but p-type AlGaN, p-type InGaN, p-type nickel oxide (NiO) or the like may be used.

In the present example, an example has been shown in which source electrode 107 is surrounded by gate electrode 106 and gate wire 110, but drain electrode 108 may be surrounded thereby. In formation of high resistance region 112, a configuration may be employed in which only undoped GaN layer 103 and undoped AlGaN layer 104 are subjected to ion implantation, and p-type semiconductor layer 105 immediately below gate wire 110 is not subjected to ion implantation. This configuration makes it possible to reduce a leak current around high resistance region 112.

An insulating film may be provided between p-type semiconductor layer 105 and gate electrode 106 and between p-type semiconductor layer 105 and gate wire 110 to form an insulating gate structure. This configuration makes it possible to further reduce a leak current.

Example 1-3

Figure 6:
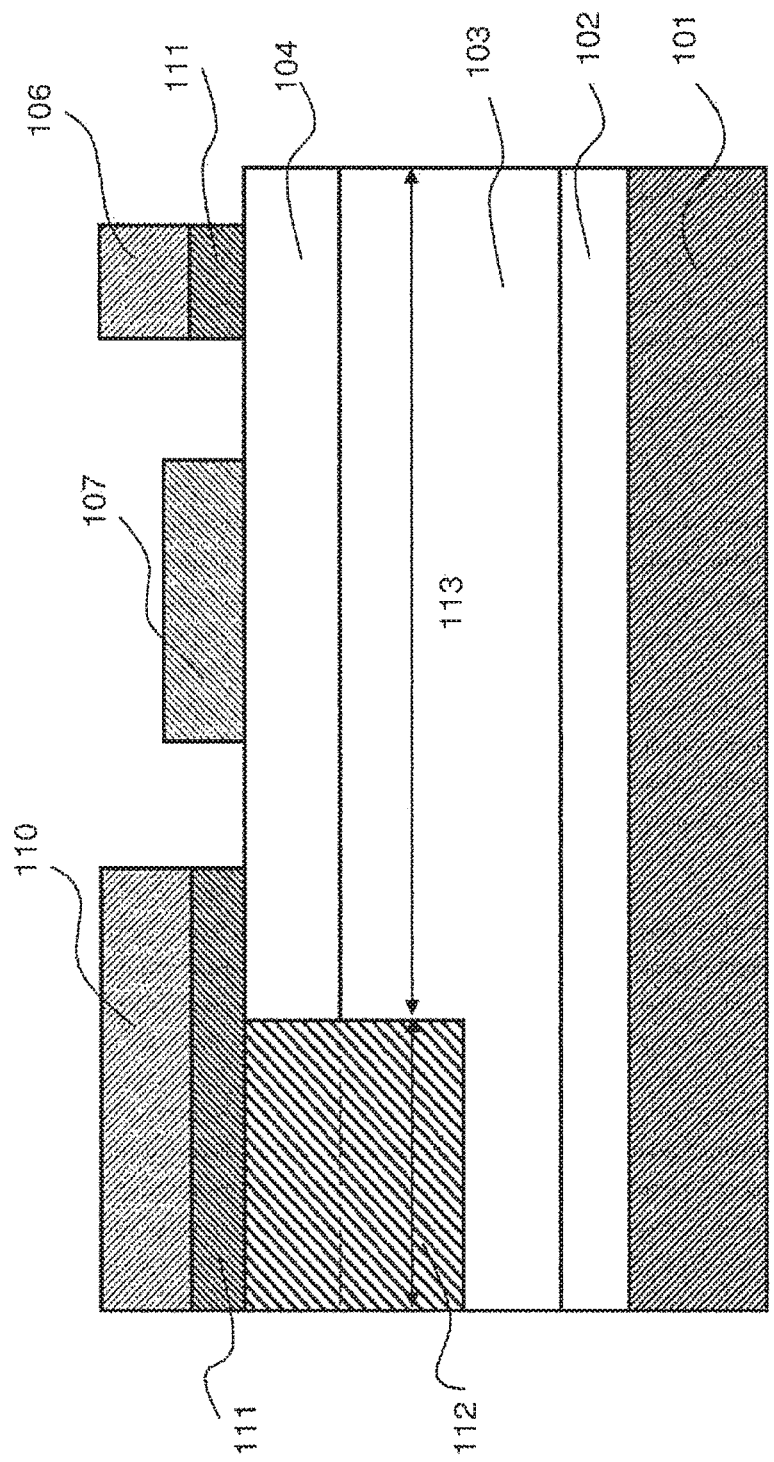
FIG. 6 is a sectional view along dashed line II-II shown in FIG. 1 of a nitride semiconductor device according to Example 1-3 in the first exemplary embodiment of the present invention.

A nitride semiconductor device according to the present example is the same as that according to Example 1 for the plan view of FIG. 1, and as shown in FIG. 6, the nitride semiconductor device is different from that according to Example 1 only in a cross section structure along dashed line II-II shown in FIG. 1.

The nitride semiconductor device according to the present example is different from that according to Example 1 in that insulating film 111 is held between undoped AlGaN layer 104 and gate electrode 105 and between undoped AlGaN layer 104 and gate wire 110 to form an insulating gate.

As insulating film 111, for example, a 50 nm-thick $SiO_2$ film or SiN film may be used.

By forming the insulating gate, a gate current can be considerably reduced as compared to a gate employing a Schottky contact. In the present exemplary embodiment, a case has been shown in which insulating film 111 has the same thickness at high resistance region 112 and element region 113, but the thickness of insulating film 111 only above high resistance region 112 may be increased. This makes it possible to further reduce a parasitic capacitance and a leak current at high resistance region 112.

In the first exemplary embodiment, ion implantation using not only Ar ions but also other ions, for example, boron (B) ions and nitrogen (N) ions can be performed for formation of high resistance region 112. High resistance region 112 may be formed by etching, and when undoped AlGaN layer 104 is removed, a two-dimensional electron gas disappears, so that high resistance region 112 can be formed. High resistance region 112 may be formed by selectively thermally oxidizing undoped AlGaN layer 104 and undoped GaN layer 103.

Second Exemplary Embodiment

Figure 7:
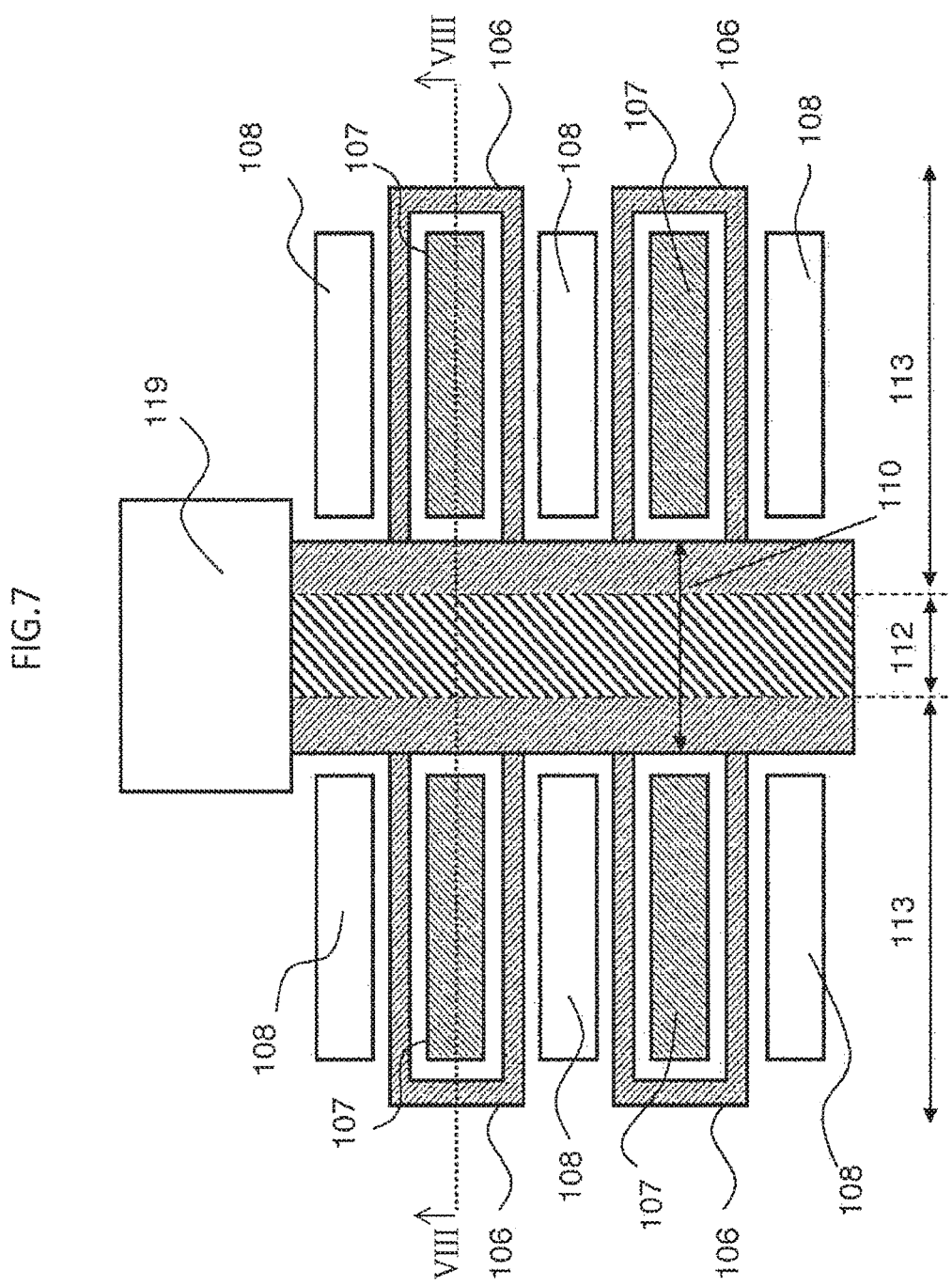
FIG. 7 is a plan view of a nitride semiconductor device according to a second exemplary embodiment of the present invention.
Figure 8:
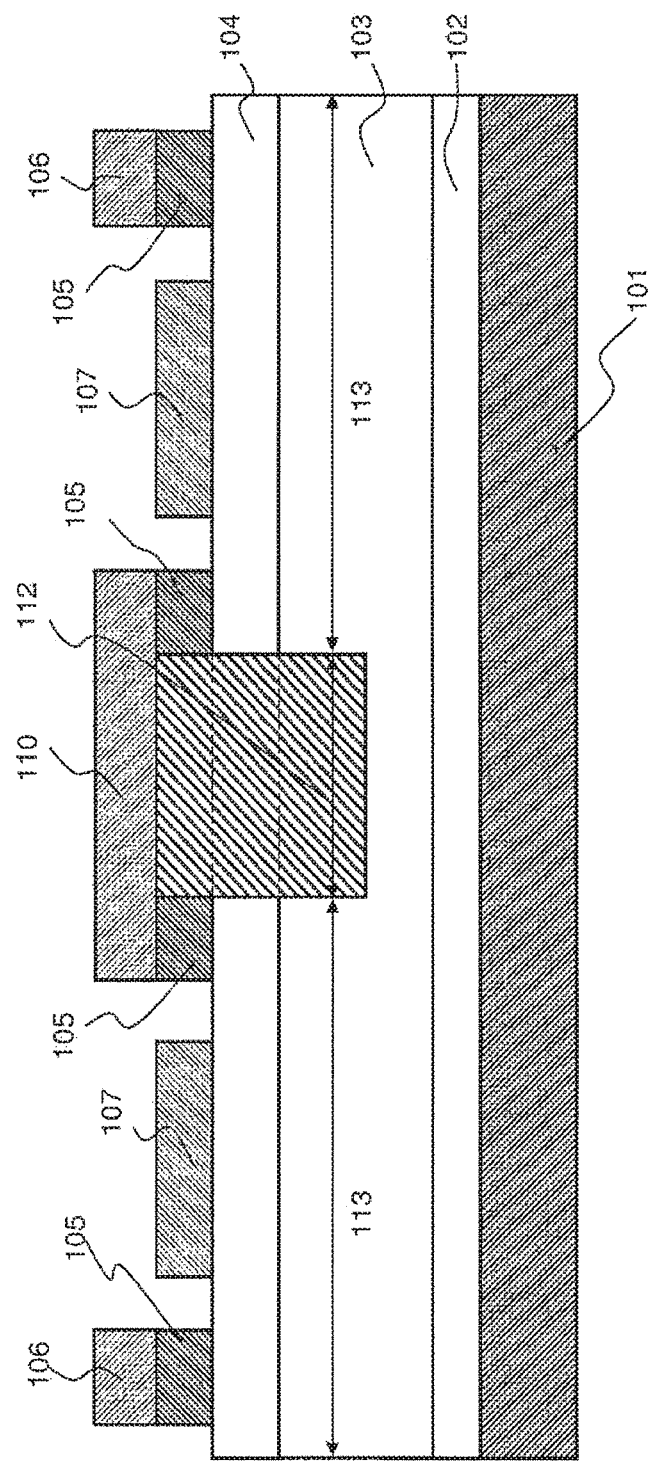
FIG. 8 is a sectional view along dashed line VIII-VIII shown in FIG. 7 of the nitride semiconductor device according to the second exemplary embodiment of the present invention.

In the nitride semiconductor device according to the first exemplary embodiment as shown in FIG. 1, an example has been shown in which gate electrode 106 is connected to one side of gate wire 110. As shown in FIG. 7, in a nitride semiconductor device according to the present exemplary embodiment, a gate electrode is connected to each of both sides of gate wire 110. Source electrode 107 is disposed so as to be surrounded by gate electrode 106 and gate wire 110. FIG. 8 is a sectional view along dashed line VIII-VIII in FIG. 7. As shown in FIG. 8, a boundary between high resistance region 112 and element region 113 is positioned immediately below gate wire 110.

Compositions and layer thicknesses of substrate 101 and layers up to and including undoped AlGaN layer 104, compositions and layer thicknesses of p-type semiconductor layer 105, and metal compositions, lengths and widths of gate electrode 106, source electrode 107, drain electrode 108 and electrode pad 119 are the same as the values described in the first exemplary embodiment.

A width of gate wire 110 is 80 µm, high resistance region 112 is formed over a region that is beyond 2 µm inside from both ends of gate wire 110 on the gate electrode 106 side by performing ion implantation using Ar ions, and an outside of high resistance region 112 is element region 113.

This configuration makes it possible to efficiently integrate a transistor.

In the present exemplary embodiment, an example has been shown in which source electrode 107 is surrounded by gate electrode 106 and gate wire 110, but drain electrode 108 may be surrounded thereby.

Modification 2-1

Figure 9:
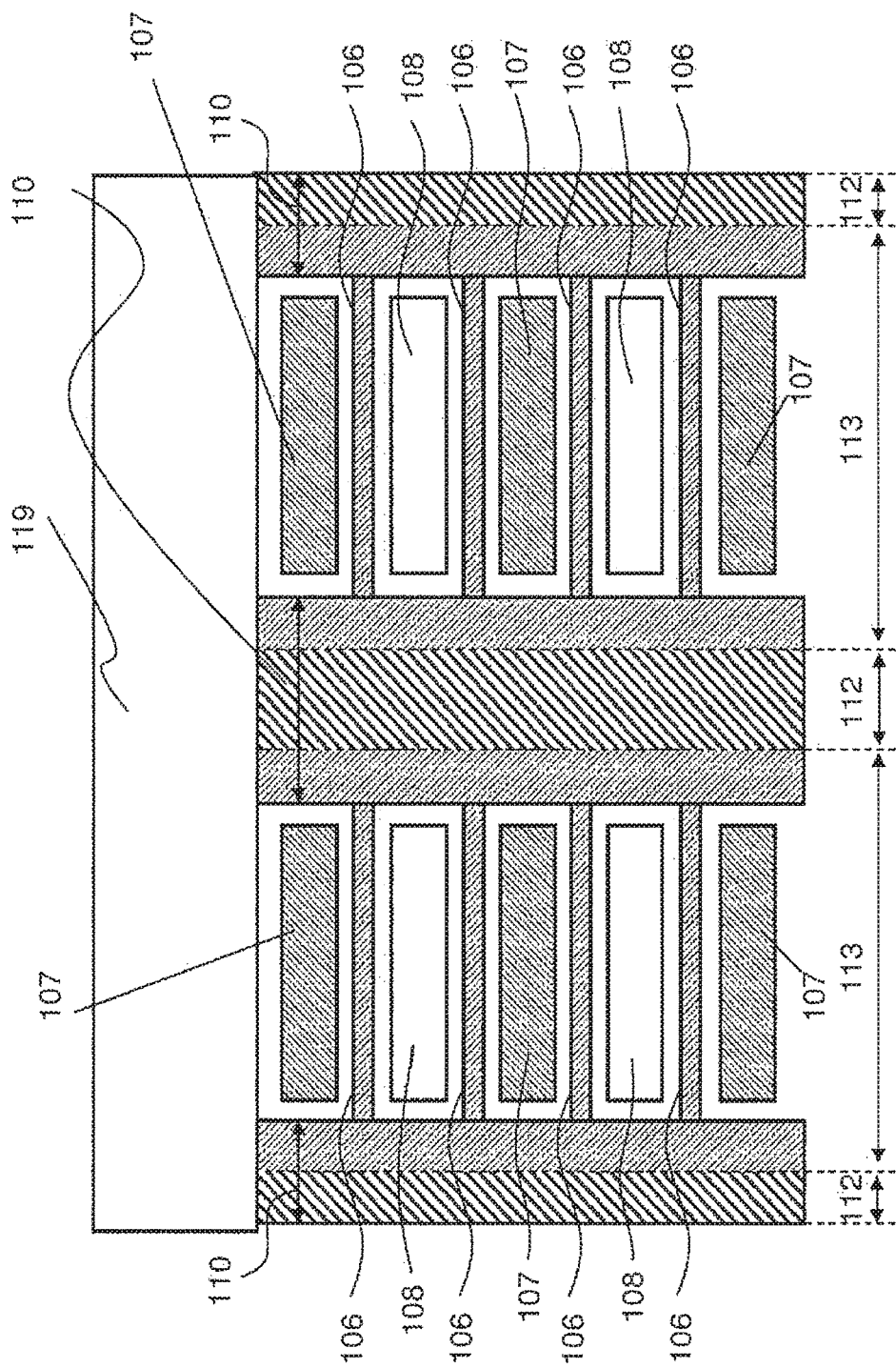
FIG. 9 is a plan view of a nitride semiconductor device according to Modification 2-1 in the second exemplary embodiment of the present invention.

As shown in FIG. 9, in a nitride semiconductor device according to Modification 2-1 of the present exemplary embodiment, a gate electrode is connected to each of both sides of central gate wire 110, and further, gate wire 110 is disposed at each of both ends of each gate electrode 106.

This configuration makes it possible to efficiently integrate a transistor while further reducing a gate resistance. In the present example, an example has been shown in which source electrode 107 is surrounded by gate electrode 106 and gate wire 110, but drain electrode 108 may be surrounded thereby. A length of gate electrode 106 from an end of gate wire 110 to an end of opposite gate wire 110 is more preferably 100 µm to 800 µm. The length of the gate electrode being less than 100 µm is not preferred because an area of a wiring portion is relatively large in integration of a transistor. The length of the gate electrode being more than 800 µm is not preferred because a gate resistance increases to adversely affect switching characteristics. When the length of gate electrode 106 is changed, a length of each of source electrode 107 and drain electrode 108 along dashed line VIII-VIII may be appropriately changed.

Modification 2-2

Figure 10:
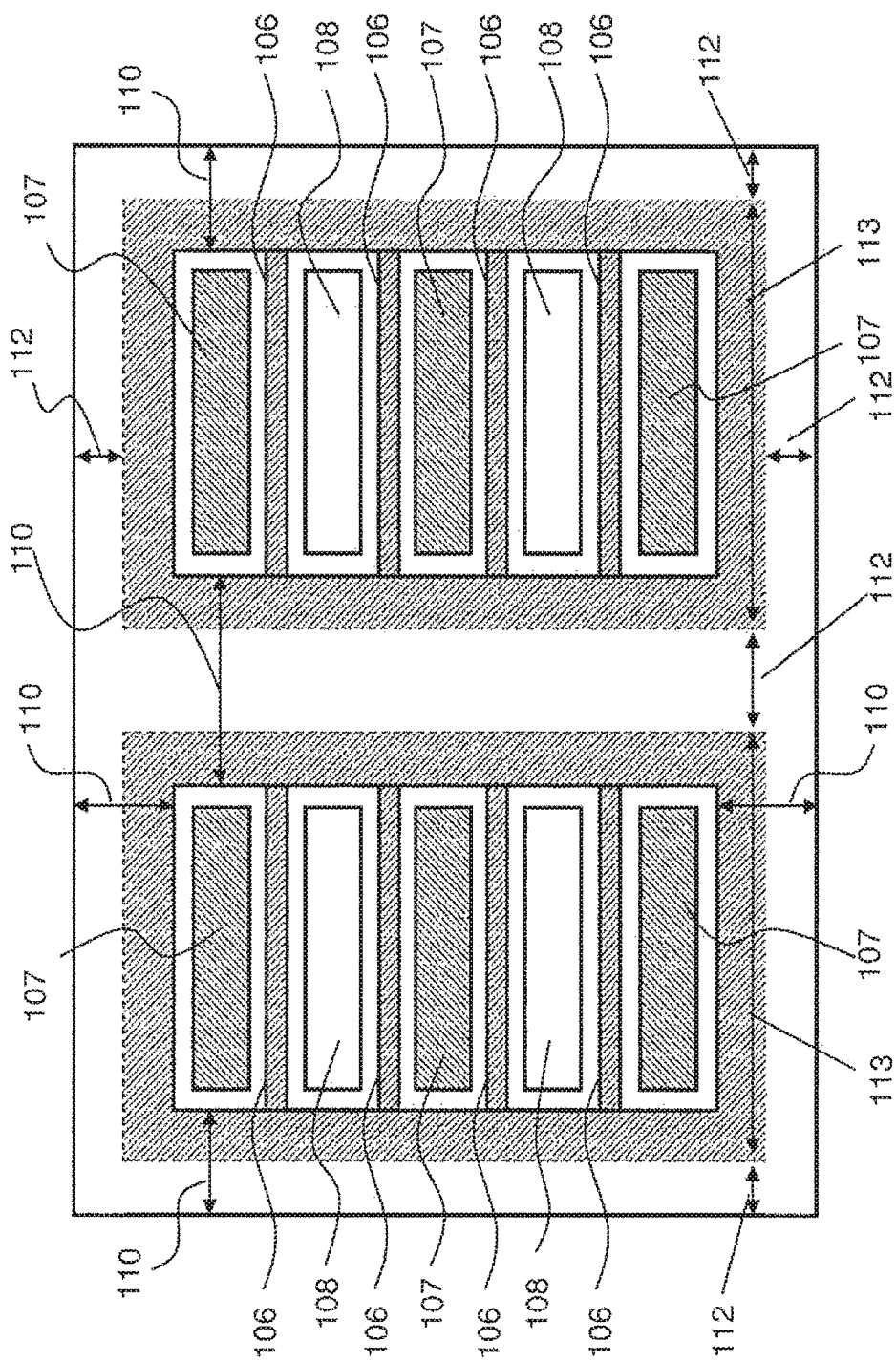
FIG. 10 is a plan view of a nitride semiconductor device according to Modification 2-2 in the second exemplary embodiment of the present invention.

As shown in FIG. 10, a nitride semiconductor device according to the present exemplary embodiment is different from the second exemplary embodiment in that unlike Modification 2-1, gate wire 110 is provided in each of upper and lower parts so as to extend parallel to gate electrode 106. Source electrode 107 is disposed so as to be surrounded by gate electrode 106 and gate wire 110. As shown in FIG. 10, a boundary between high resistance region 112 and element region 113 is positioned immediately below gate wire 110.

This configuration makes it possible to efficiently integrate a transistor while reducing a gate resistance. In the present example, an example has been shown in which source electrode 107 is surrounded by gate electrode 106 and gate wire 110, but drain electrode 108 may be surrounded thereby.

Modification 2-3

Figure 11:
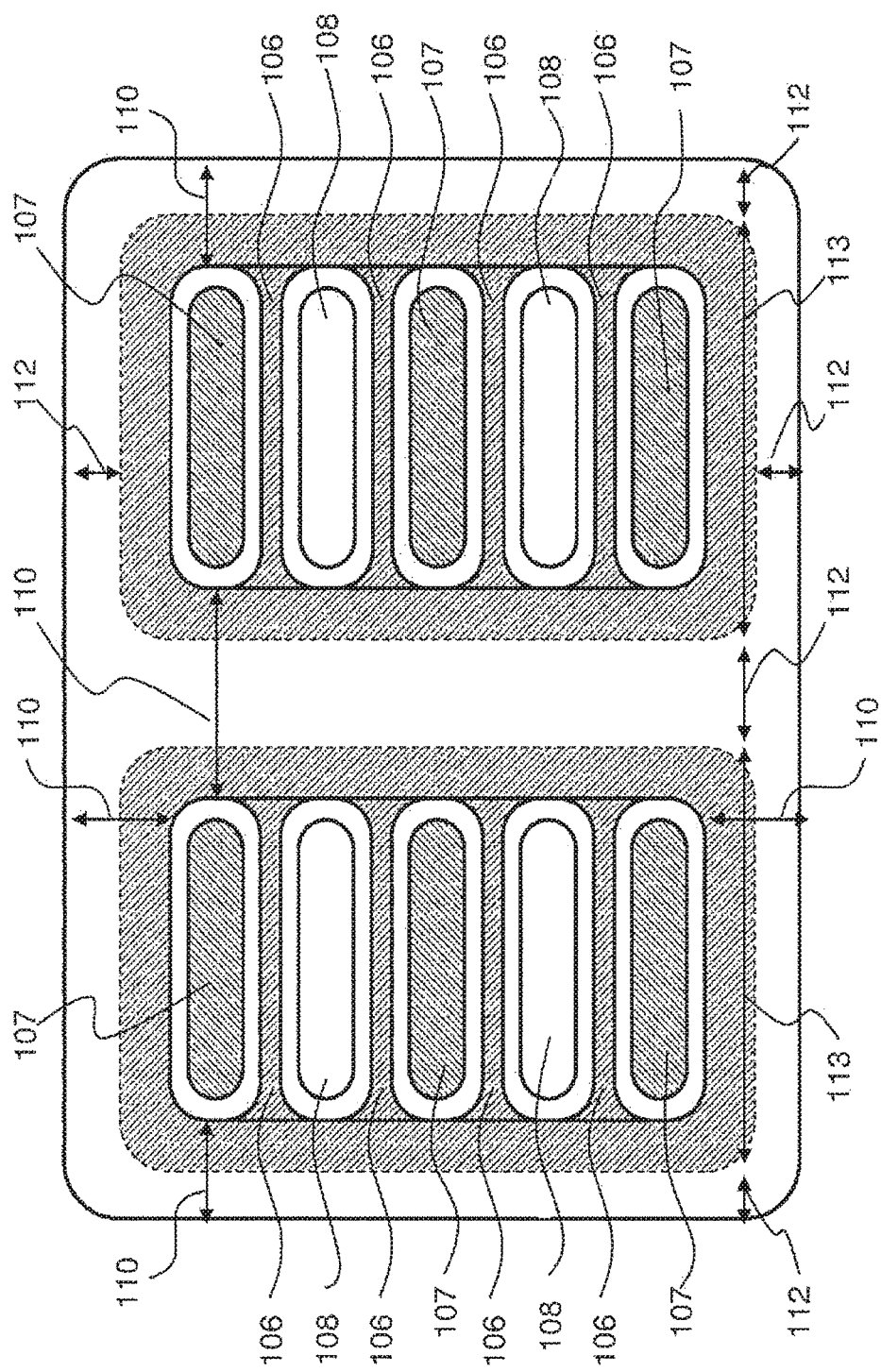
FIG. 11 is a plan view of a nitride semiconductor device according to Modification 2-3 in the second exemplary embodiment of the present invention.

A nitride semiconductor device according to the present modification is obtained by rounding an end of each of gate electrode 106, source electrode 107 and drain electrode 108 in the nitride semiconductor device shown in the plan view of FIG. 10, and a plan view of the nitride semiconductor device according to the present modification is shown in FIG. 11. Compositions and layer thicknesses of substrate 101 and layers up to and including undoped AlGaN layer 104, and metal compositions, lengths and widths of gate electrode 106, source electrode 107, drain electrode 108, wiring layer 110 and electrode pad 119 are the same as in Modification 2-2. An end of each of gate electrode 106, source electrode 107 and drain electrode 108 is formed in an arc shape. Consequently, electric filed concentration can be suppressed. A sectional view of this nitride semiconductor device is the same as FIG. 8.

This configuration makes it possible to efficiently integrate a transistor while reducing a gate resistance. In the present example, an example has been shown in which source electrode 107 is surrounded by gate electrode 106 and gate wire 110, but drain electrode 108 may be surrounded thereby.

In the second exemplary embodiment including Modifications 2-1, 2-2 and 2-3, it is possible to not only use a Schottky electrode for gate electrode 106, but also to form a p-type semiconductor layer and an insulating gate.

In the second exemplary embodiment, ion implantation using not only Ar ions but also other ions, for example, boron ions and nitrogen ions can be performed for formation of high resistance region 112. High resistance region 112 may be formed by etching, and when undoped AlGaN layer 104 is removed, a two-dimensional electron gas disappears, so that high resistance region 112 can be formed. High resistance region 112 may be formed by selectively thermally oxidizing undoped AlGaN layer 104 and undoped GaN layer 103.

Third Exemplary Embodiment

Figure 12:
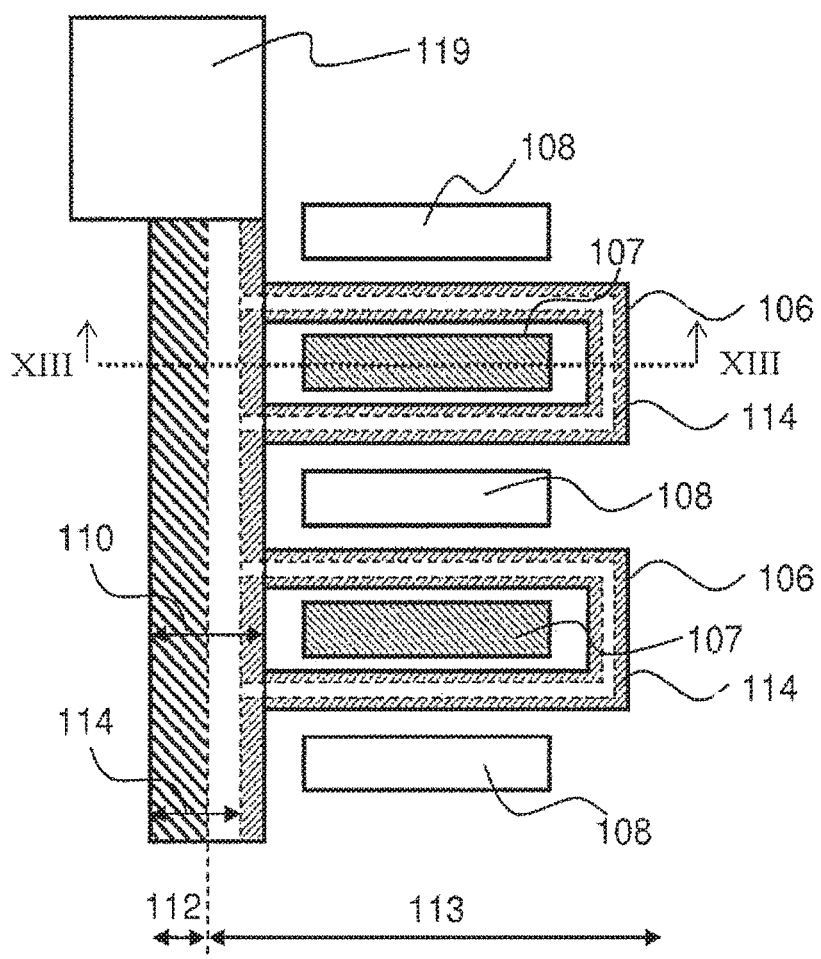
FIG. 12 is a plan view of a nitride semiconductor device according to a third exemplary embodiment of the present invention.

FIG. 12 is a plan view showing a structure of a nitride semiconductor device according to a third exemplary embodiment of the present invention.

Example 3-1

Figure 13:
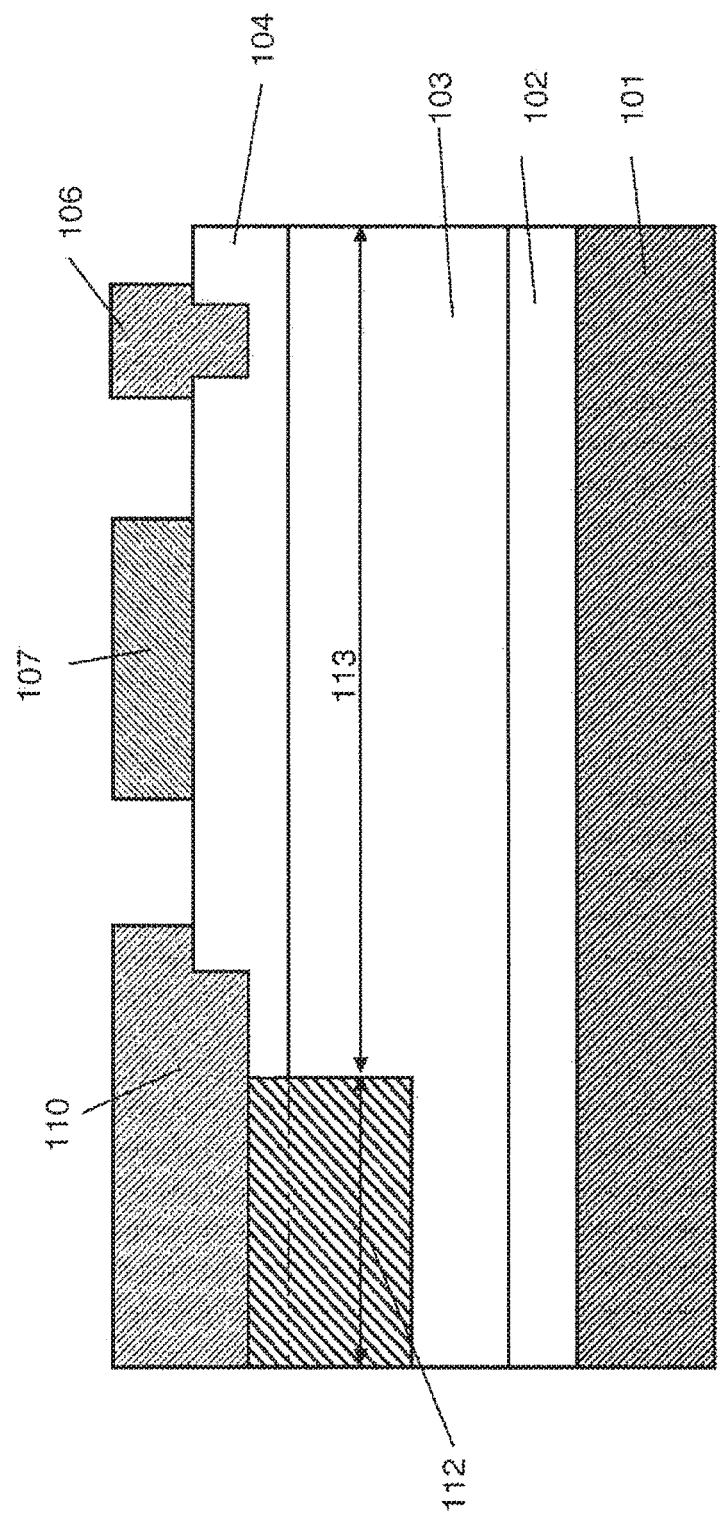
FIG. 13 is a sectional view along dashed line XIII-XIII shown in FIG. 12 of a nitride semiconductor device according to Example 3-1 in the third exemplary embodiment of the present invention.

FIG. 13 is a sectional view showing a structure of the nitride semiconductor device along dashed line XIII-XIII shown in FIG. 12.

As shown in FIG. 12 and FIG. 13, the nitride semiconductor device according to the present example is configured such that gate recess region 114 as a depression is formed on undoped AlGaN layer 104 immediately below gate electrode 106 and gate wire 110, and gate electrode 106 and gate wire 110 are formed so as to embed gate recess region 114. A side wall of gate recess region 114 of undoped AlGaN layer 104 is positioned immediately below gate wire 110. Further, in the depression region of undoped AlGaN layer 104 immediately below gate wire 110, high resistance region 112, the resistance of which is increased by, for example, ion implantation using Ar ions, is formed on undoped GaN layer 103 and undoped AlGaN layer 104, and a boundary between high resistance region 112 and element region 113 is positioned immediately below the gate wire.

Undoped AlGaN layer 104 has a thickness of 50 nm, and gate recess region 114 immediately below gate electrode 106 has a width of 0.5 μm and a depth of 30 nm. That is, a remaining thickness of undoped AlGaN layer 104 in gate recess region 114 is 20 nm.

Gate recess region 114 immediately below gate wire 110 is equivalent to gate recess region 114 immediately below gate electrode 106 with a depression formed from a region that is 1 μm inside from an end of gate wire 110 on the gate electrode 106 side.

Compositions and layer thicknesses of substrate 101 and layers up to and including undoped GaN layer 103, compositions and layer thicknesses of p-type semiconductor layer 105, and metal compositions, lengths and widths of gate electrode 106, source electrode 107, drain electrode 108 and electrode pad 119 are the same as the values described in the first exemplary embodiment.

A width of gate wire 110 is 40 μm, high resistance region 112 is formed over a region that is beyond 2 μm inside from an end of gate wire 110 on the gate electrode 106 side by performing ion implantation using Ar ions, and the outside of high resistance region 112 is element region 113.

This configuration makes it possible to increase the thickness of the undoped AlGaN layer excluding gate recess region 114 because a threshold voltage of a transistor depends on the thickness of undoped AlGaN layer 104 in gate recess region 114. As a result, a decrease in on-resistance and an increase in current can be achieved due to an increase in concentration of a two dimensional electron gas. Further, when the layer thickness of the undoped AlGaN layer excluding gate recess region 114 is increased, a distance between the surface and the two-dimensional electron gas is longer, so that deterioration of a transient response, such as current collapse, can be suppressed.

Modification 3-1

Figure 14:
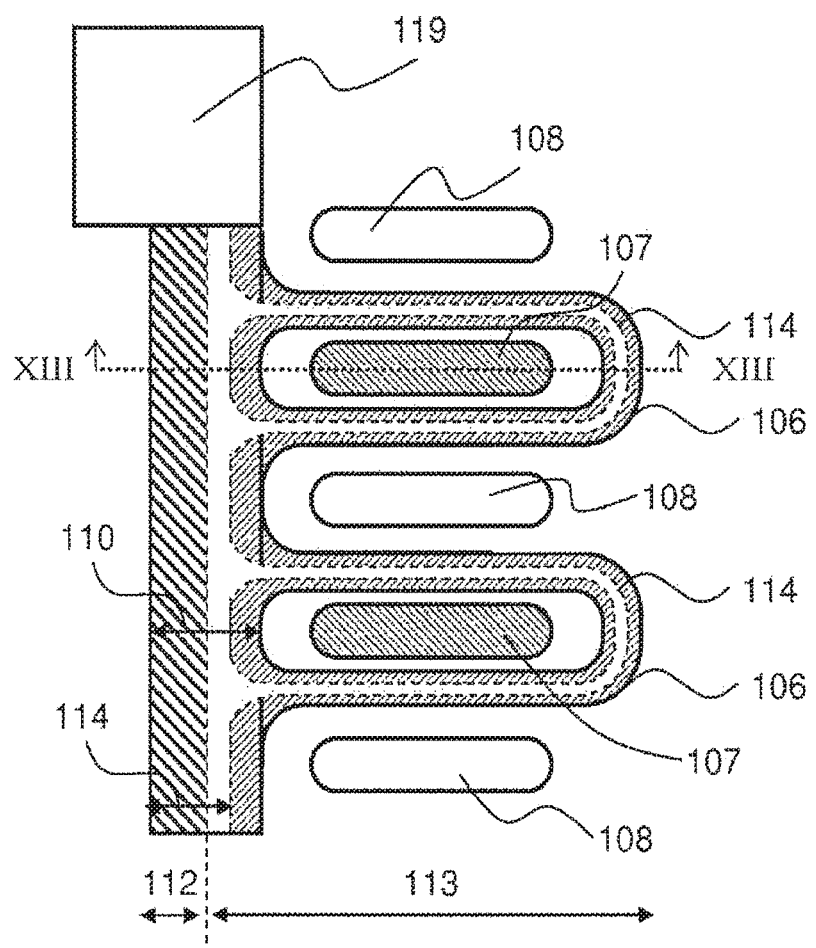
FIG. 14 is a plan view of a nitride semiconductor device according to Modification 3-1 in the third exemplary embodiment of the present invention.

A nitride semiconductor device according to the present modification is obtained by rounding an end of each of gate electrode 106, source electrode 107 and drain electrode 108 in the nitride semiconductor device shown in the plan view of FIG. 12, and a plan view of the nitride semiconductor device according to the present modification is shown in FIG. 14. Compositions and layer thicknesses of substrate 101 and layers up to and including undoped AlGaN layer 104, metal compositions, lengths and widths of gate electrode 106, source electrode 107, drain electrode 108, wiring layer 110 and electrode pad 119, and a width of gate recess region 114 are the same as in Example 3-1. An end of each of gate electrode 106, source electrode 107 and drain electrode 108 is formed in an arc shape. Consequently, electric filed concentration can be suppressed. A sectional view along dashed line XIII-XIII in FIG. 14 of this nitride semiconductor device is the same as FIG. 13.

This configuration makes it possible to increase the thickness of the undoped AlGaN layer excluding gate recess region 114 because a threshold voltage of a transistor depends on the thickness of undoped AlGaN layer 104 in gate recess region 114. As a result, a decrease in on-resistance and an increase in current can be achieved due to an increase in concentration of a two dimensional electron gas. Further, when the layer thickness of the undoped AlGaN layer excluding gate recess region 114 is increased, a distance between the surface and the two-dimensional electron gas is longer, so that deterioration of a transient response, such as current collapse, can be suppressed.

Example 3-2

Figure 15:
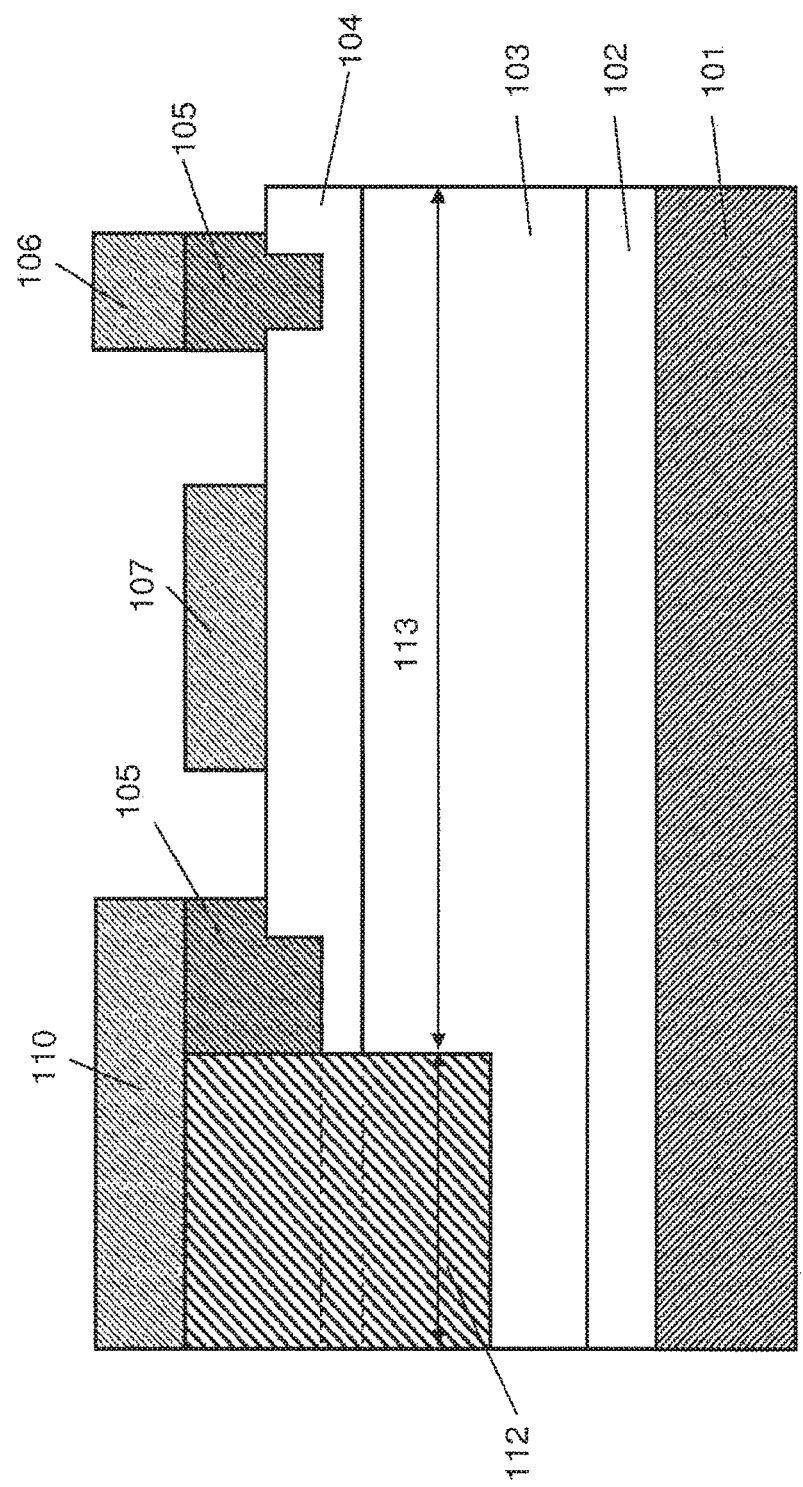
FIG. 15 is a sectional view along dashed line XIII-XIII shown in FIG. 12 of a nitride semiconductor device according to Example 3-2 in the third exemplary embodiment of the present invention.

A nitride semiconductor device according to the present example is the same as that according to Example 3-1 for the plan view of FIG. 12, and as shown in FIG. 15, the nitride semiconductor device is different from that according to Example 3-1 only in a cross section structure along dashed line XIII-XIII shown in FIG. 12.

As shown in FIG. 15, the nitride semiconductor device according to the present exemplary embodiment is configured such that p-type semiconductor layer 105 is formed so as to embed the depression region of undoped AlGaN layer 104, and gate electrode 106 and gate wire 110 are formed so as to be in contact with p-type semiconductor layer 105. A side wall of gate recess region 114 of the undoped AlGaN layer is positioned immediately below gate wire 110. Further, in undoped GaN layer 103, undoped AlGaN layer 104 and p-type semiconductor layer 105 immediately below gate wire 110, for example, high resistance region 112, the resistance of which is increased by ion implantation using Ar ions etc., is formed, and a boundary between high resistance region 112 and element region 113 is positioned immediately below the gate wire.

For p-type semiconductor layer 105, Mg-doped p-type GaN is used.

In the semiconductor device of the present example, a high-concentration two-dimensional electron gas is formed at an interface between undoped GaN layer 103 and undoped AlGaN layer 104, so that large-current and low-on-resistance operation can be performed. Due to connection of p-type semiconductor layer 105, a potential at the interface between undoped GaN layer 103 and undoped AlGaN layer 104 increases, and therefore normally-off operation can be performed in which at a gate voltage of 0 V, a two-dimensional electron gas is no longer generated, so that safety of power supply equipment and so on can be secured. Since the thickness of undoped AlGaN layer 104 excluding gate recess region 114 can be increased, a decrease in on-resistance and an increase in current can be achieved.

In formation of high resistance region 112, a configuration may be employed in which only undoped GaN layer 103 and undoped AlGaN layer 104 are subjected to ion implantation, and p-type semiconductor layer 105 immediately below gate wire 110 is not subjected to ion implantation. This configuration makes it possible to reduce a leak current around high resistance region 112.

In the present example, as the p-type semiconductor layer, a p-type GaN layer is used, but p-type AlGaN, p-type InGaN, p-type nickel oxide (NiO) or the like may be used.

Example 3-3

Figure 16:
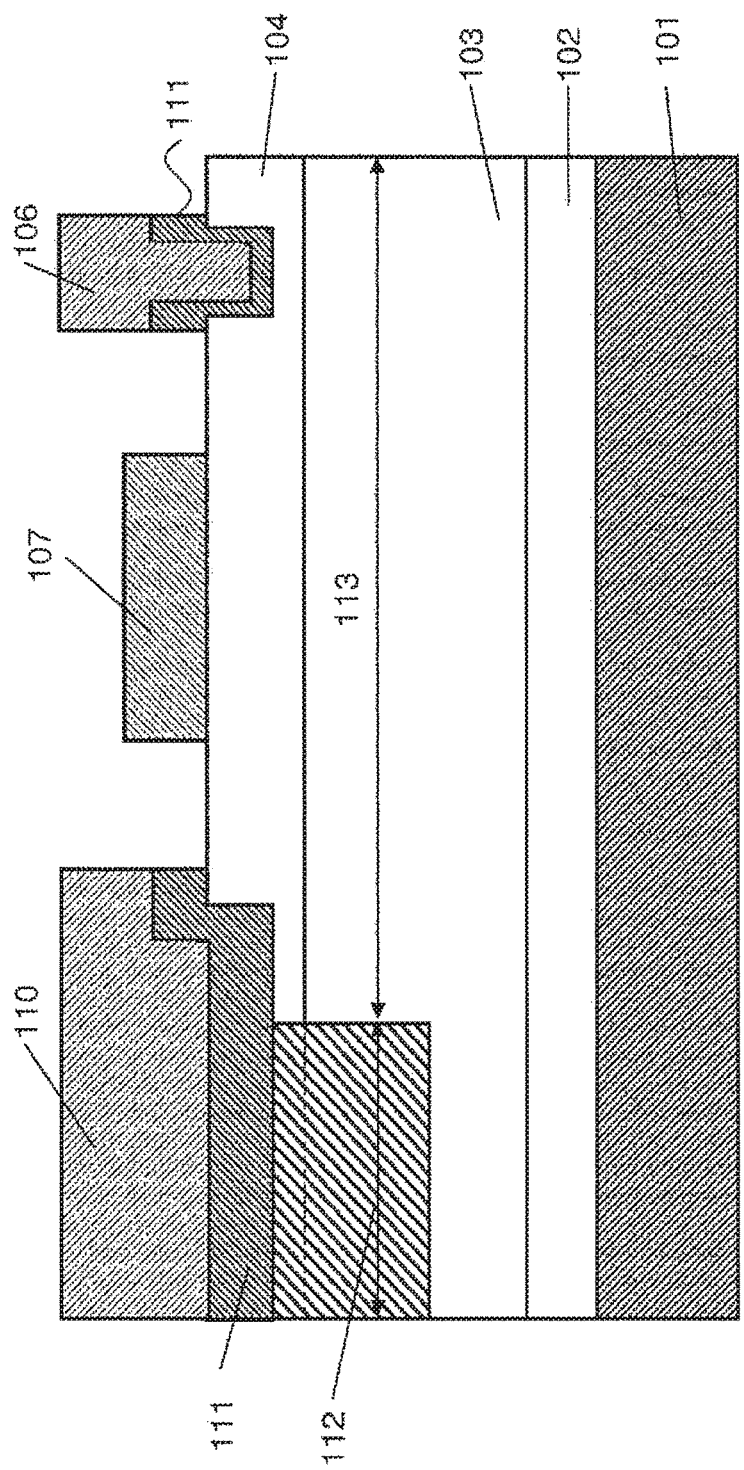
FIG. 16 is a sectional view along dashed line XIII-XIII shown in FIG. 12 of a nitride semiconductor device according to Example 3-3 in the third exemplary embodiment of the present invention.

A nitride semiconductor device according to the present example is the same as that according to Example 3-1 for the plan view of FIG. 12, and as shown in FIG. 16, the nitride semiconductor device is different from that according to Example 3-1 only in a cross section structure along dashed line XIII-XIII shown in FIG. 12.

The nitride semiconductor device according to the present exemplary embodiment is different from the third exemplary embodiment in that insulating film 111 is held between undoped AlGaN layer 104 and gate electrode 105 and between undoped AlGaN layer 104 and gate wire 110 to form an insulating gate.

As insulating film 111, for example, a 50 nm-thick $SiO_2$ film or SiN film may be used.

By forming the insulating gate, a gate current can be considerably reduced as compared to a gate employing a Schottky contact. In the present example, a case has been shown in which insulating film 111 has the same thickness at high resistance region 112 and element region 113, but the thickness of insulating film 111 only above high resistance region 112 may be increased. This makes it possible to further reduce a parasitic capacitance and a leak current at high resistance region 112.

Modification 3-2

Figure 17:
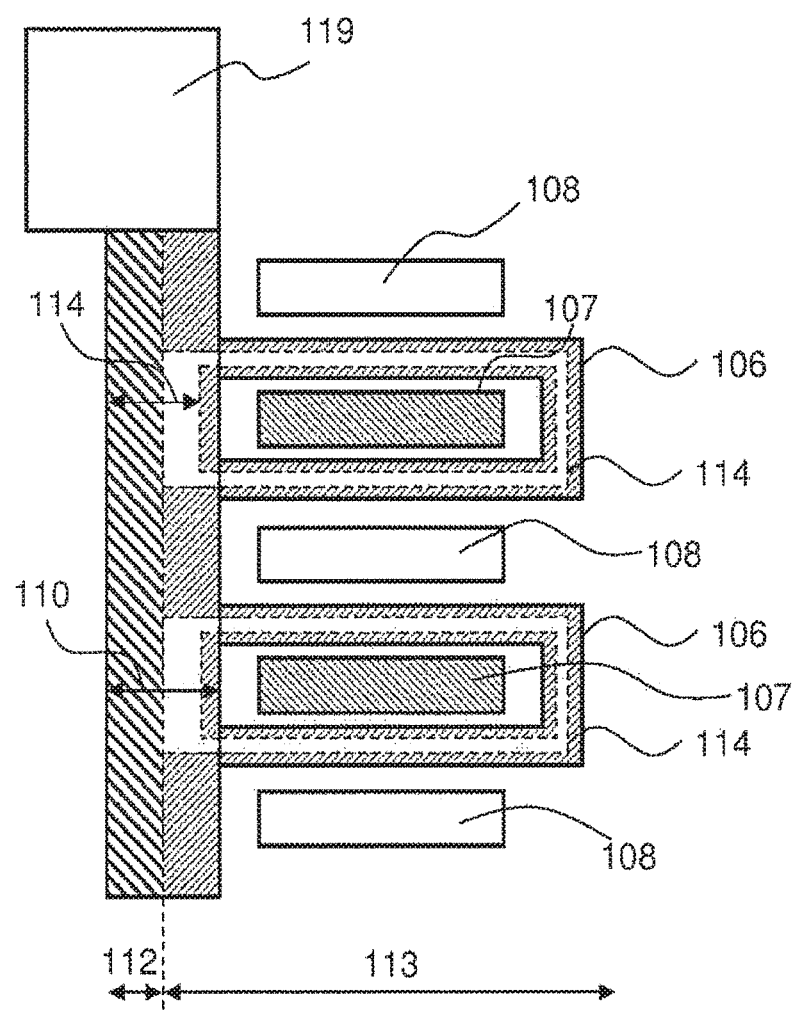
FIG. 17 is a plan view of a nitride semiconductor device according to Modification 3-2 in the third exemplary embodiment of the present invention.

As shown in FIG. 17, a nitride semiconductor device according to the present example is different from the nitride semiconductor device according to Example 3-1 in that gate recess region 114 of undoped AlGaN layer 104 is formed so as to surround only a periphery of source electrode 107. In this configuration, the same effect as in Example 3-1 can be obtained.

In the present example, an example has been shown in which source electrode 107 is surrounded by gate electrode 106 and gate wire 110, but drain electrode 108 may be surrounded thereby. It is also possible to form a p-type semiconductor layer and an insulating gate.

In the third exemplary embodiment, ion implantation using not only Ar ions but also other ions, for example, boron ions and nitrogen ions can be performed for formation of high resistance region 112. High resistance region 112 may be formed by etching, and when undoped AlGaN layer 104 is removed, a two-dimensional electron gas disappears, so that high resistance region 112 can be formed. High resistance region 112 may be formed by selectively thermally oxidizing undoped AlGaN layer 104 and undoped GaN layer 103.

Fourth Exemplary Embodiment

Figure 18:
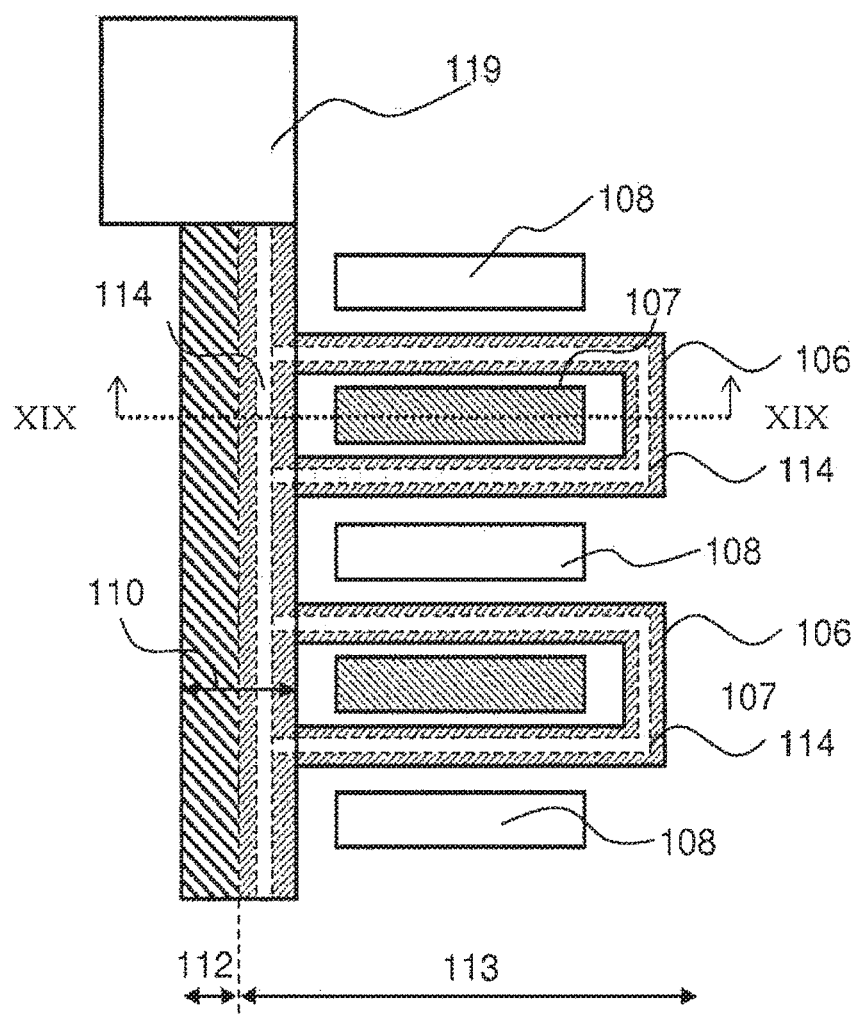
FIG. 18 is a plan view of a nitride semiconductor device according to a fourth exemplary embodiment of the present invention.

FIG. 18 is a plan view showing a structure of a nitride semiconductor device according to a fourth exemplary embodiment of the present invention.

Example 4-1

Figure 19:
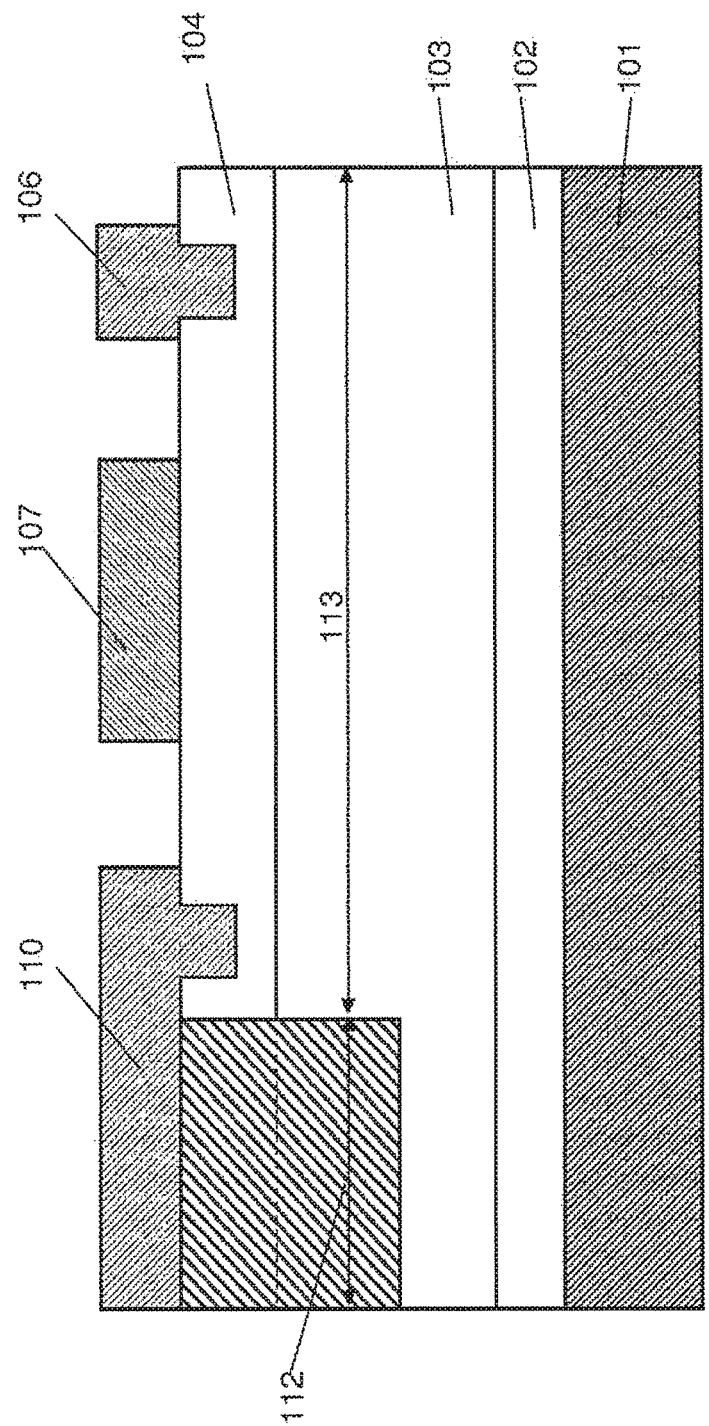
FIG. 19 is a sectional view along dashed line XIX-XIX shown in FIG. 18 of a nitride semiconductor device according to Example 4-1 in the fourth exemplary embodiment of the present invention.

FIG. 19 is a sectional view showing a structure of the nitride semiconductor device along dashed line XIX-XIX shown in FIG. 18.

As shown in FIG. 18, the nitride semiconductor device according to the present exemplary embodiment is different from the third exemplary embodiment in that gate recess region 114 is formed only on element region 113 immediately below gate wire 110.

For gate recess region 114 immediately below gate wire 110, a depression having a width of 0.5 µm is formed from a region that is 1 µm inside from an end of gate wire 110 on the gate electrode 106 side.

Compositions and layer thicknesses of substrate 101 and layers up to and including undoped AlGaN layer 104, and metal compositions, lengths and widths of gate electrode 106, source electrode 107, drain electrode 108 and electrode pad 119 are the same as the values described in the third exemplary embodiment.

A width of gate wire 110 is 40 µm, high resistance region 112 is formed over a region that is beyond 2 µm inside from an end of gate wire 110 on the gate electrode 106 side by performing ion implantation using Ar ions, and the outside of high resistance region 112 is element region 113.

Gate wire 110 is formed so as to embed gate recess region 114. This configuration makes it possible to reduce influences of irregularities by decreasing an area of gate recess region 114.

In the present example, an example has been shown in which source electrode 107 is surrounded by gate electrode 106 and gate wire 110, but drain electrode 108 may be surrounded thereby.

Example 4-2

Figure 20:
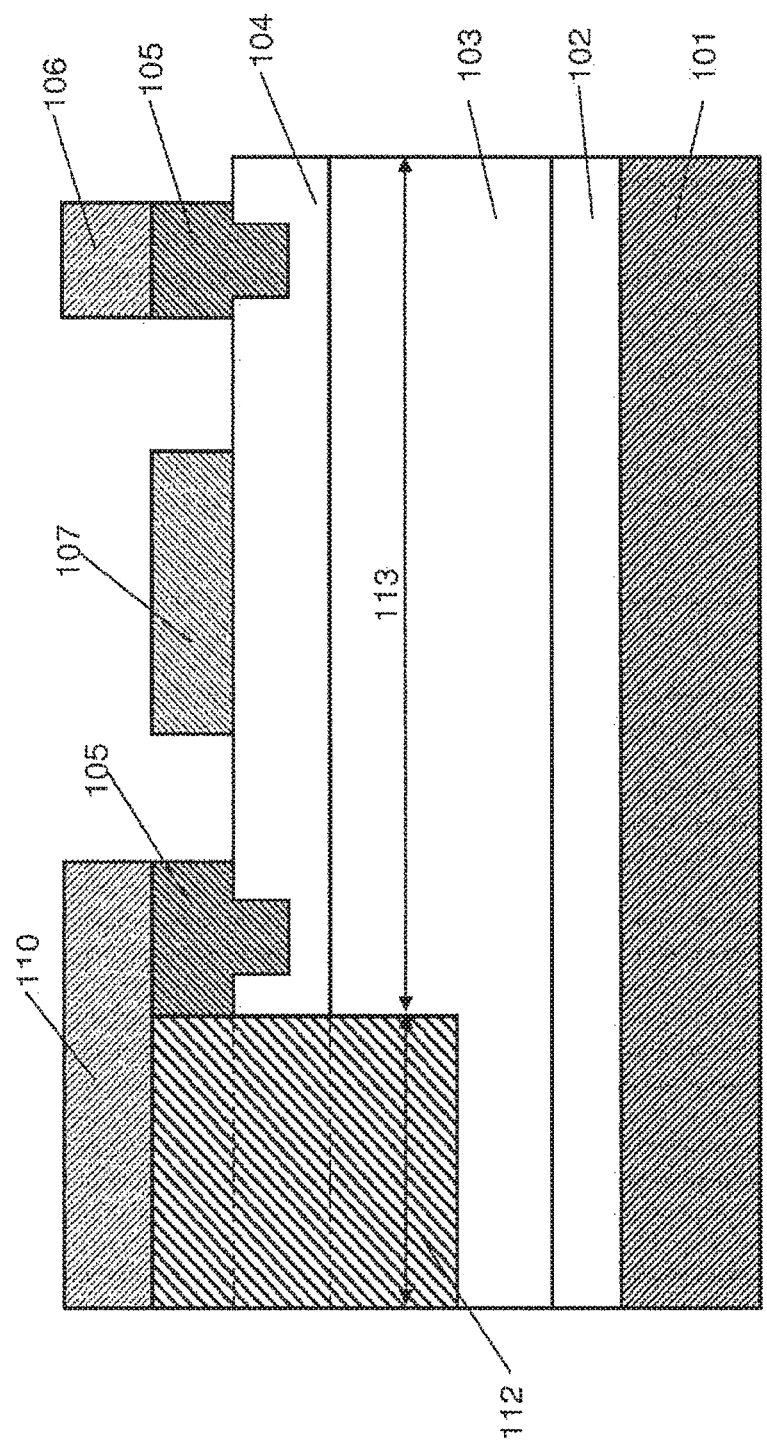
FIG. 20 is a sectional view of a nitride semiconductor device according to Example 4-2 in the fourth exemplary embodiment of the present invention.

As shown in FIG. 20, the nitride semiconductor device according to the present exemplary embodiment is different from that according to Example 3-2 in that gate recess region 114 is formed only on element region 113 immediately below gate wire 110.

For gate recess region 114 immediately below gate wire 110, a depression having a width of 0.5 µm is formed from a region that is 1 µm inside from an end of gate wire 110 on the gate electrode 106 side.

p-type semiconductor layer 105 is formed so as to embed gate recess region 114. This configuration makes it possible to reduce influences of irregularities by decreasing an area of gate recess region 114.

In the present example, an example has been shown in which source electrode 107 is surrounded by gate electrode 106 and gate wire 110, but drain electrode 108 may be surrounded thereby.

Example 4-3

Figure 21:
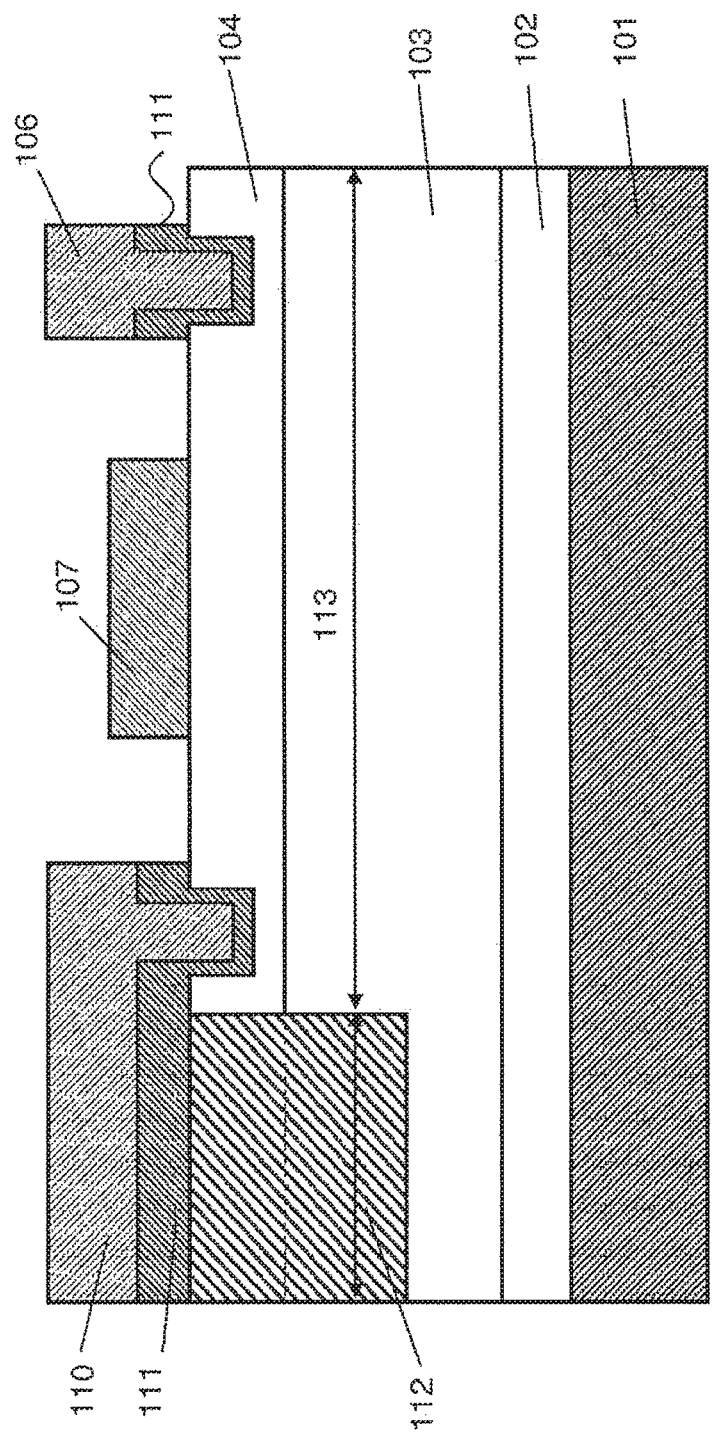
FIG. 21 is a sectional view of a nitride semiconductor device according to Example 4-3 in the fourth exemplary embodiment of the present invention.

As shown in FIG. 21, the nitride semiconductor device according to the present example is different from that according to Example 3-3 in that gate recess region 114 is formed only on element region 113 immediately below gate wire 110. Insulator 111 and gate wire 110 are formed so as to embed gate recess region 114.

As insulating film 111, for example, a 50 nm-thick $SiO_2$ film or SiN film may be used.

For gate recess region 114 immediately below gate wire 110, a depression having a width of 0.5 µm is formed from a region that is 1 µm inside from an end of gate wire 110 on the gate electrode 106 side.

This configuration makes it possible to reduce influences of irregularities by decreasing an area of gate recess region 114.

In the present example, an example has been shown in which source electrode 107 is surrounded by gate electrode 106 and gate wire 110, but drain electrode 108 may be surrounded thereby.

Modification 4-1

Figure 22:
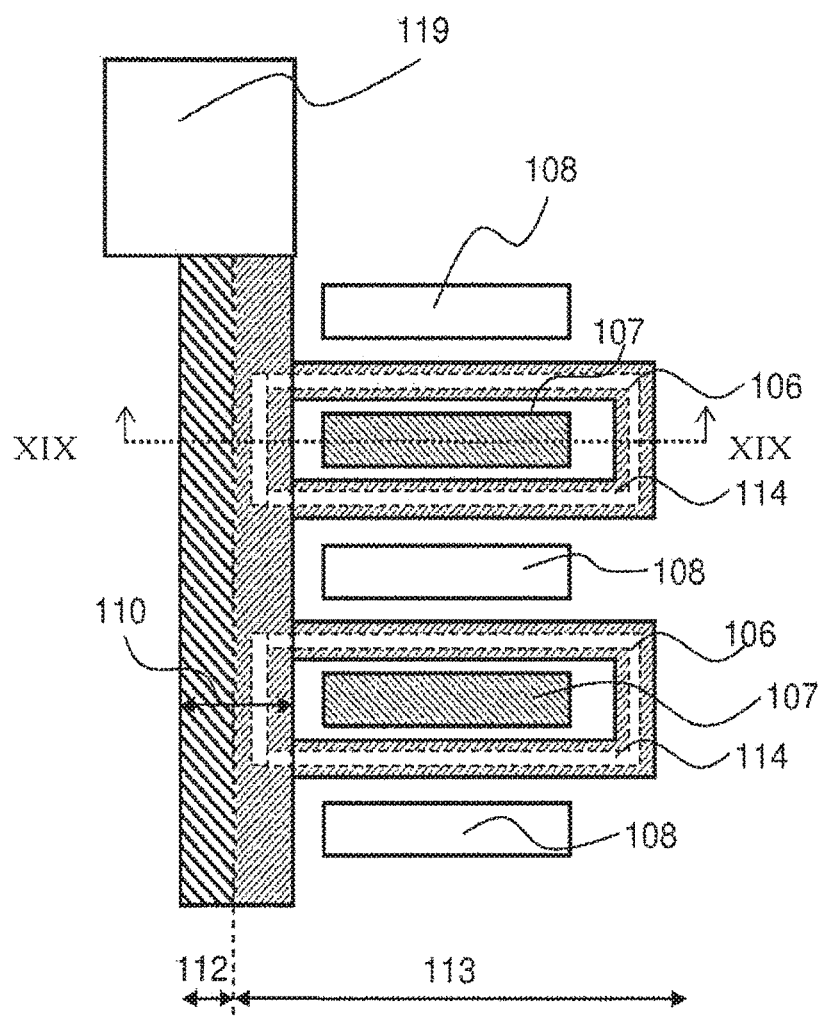
FIG. 22 is a plan view of a nitride semiconductor device according to Modification 4-1 in the fourth exemplary embodiment of the present invention.

As shown in FIG. 22, a nitride semiconductor device according to the present modification is different from the nitride semiconductor device according to Example 4-1 in that gate recess region 114 of undoped AlGaN layer 104 is formed so as to surround only a periphery of source electrode 107. In this configuration, the same effect as in Example 4-1 can be obtained.

In the present modification, an example has been shown in which source electrode 107 is surrounded by gate electrode 106 and gate wire 110, but drain electrode 108 may be surrounded thereby. It is also possible to form a Schottky gate, a p-type semiconductor layer and an insulating gate for the gate. A sectional view along dashed line XIX-XIX in FIG. 22 of this nitride semiconductor device is the same as FIG. 19.

Modification 4-2

Figure 23:
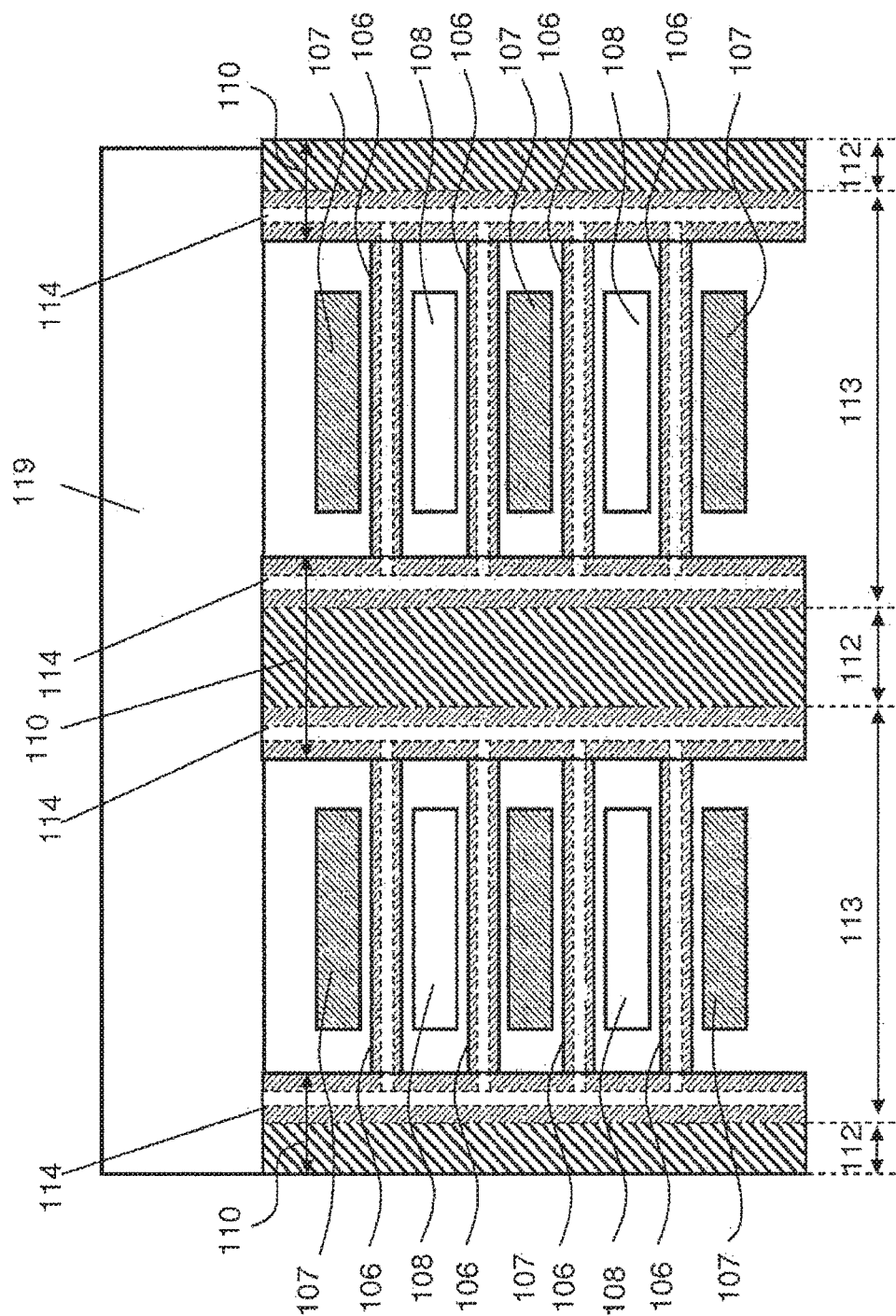
FIG. 23 is a plan view of a nitride semiconductor device according to Modification 4-2 in the fourth exemplary embodiment of the present invention.

As shown in FIG. 23, a nitride semiconductor device according to the present example is different from that according to Example 4-1 in that a gate electrode is connected to each of both sides of central gate wire 110, and further, gate wire 110 is disposed at each of both ends of each gate electrode 106.

This configuration makes it possible to efficiently integrate a transistor while further reducing a gate resistance. In the present example, an example has been shown in which source electrode 107 is surrounded by gate electrode 106 and gate wire 110, but drain electrode 108 may be surrounded thereby. It is also possible to form a Schottky gate, a p-type semiconductor layer and an insulating gate for the gate.

Modification 4-3

Figure 24:
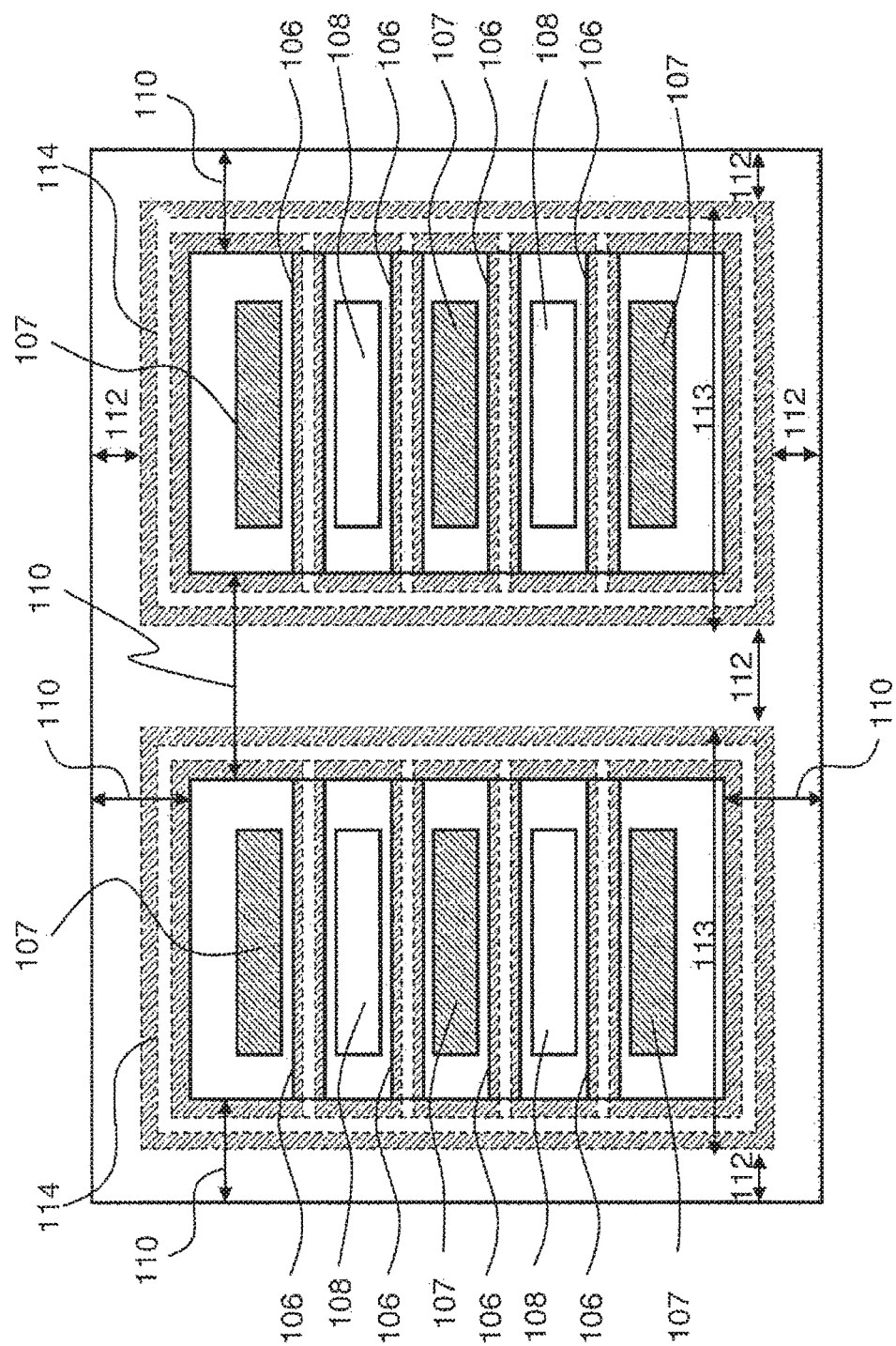
FIG. 24 is a plan view of a nitride semiconductor device according to Modification 4-3 in the fourth exemplary embodiment of the present invention.

As shown in FIG. 24, a nitride semiconductor device according to the present example is different from that according to Modification 4-2 in that gate wire 110 is provided in each of upper and lower parts so as to extend parallel to gate electrode 106. Source electrode 107 and drain electrode 108 are disposed so as to be surrounded by gate electrode 106 and gate wire 110. As shown in FIG. 24, a boundary between high resistance region 112 and element region 113 is positioned immediately below gate wire 110.

This configuration makes it possible to efficiently integrate a transistor while reducing a gate resistance. It is also possible to form a Schottky gate, a p-type semiconductor layer and an insulating gate for the gate.

Modification 4-4

Figure 25:
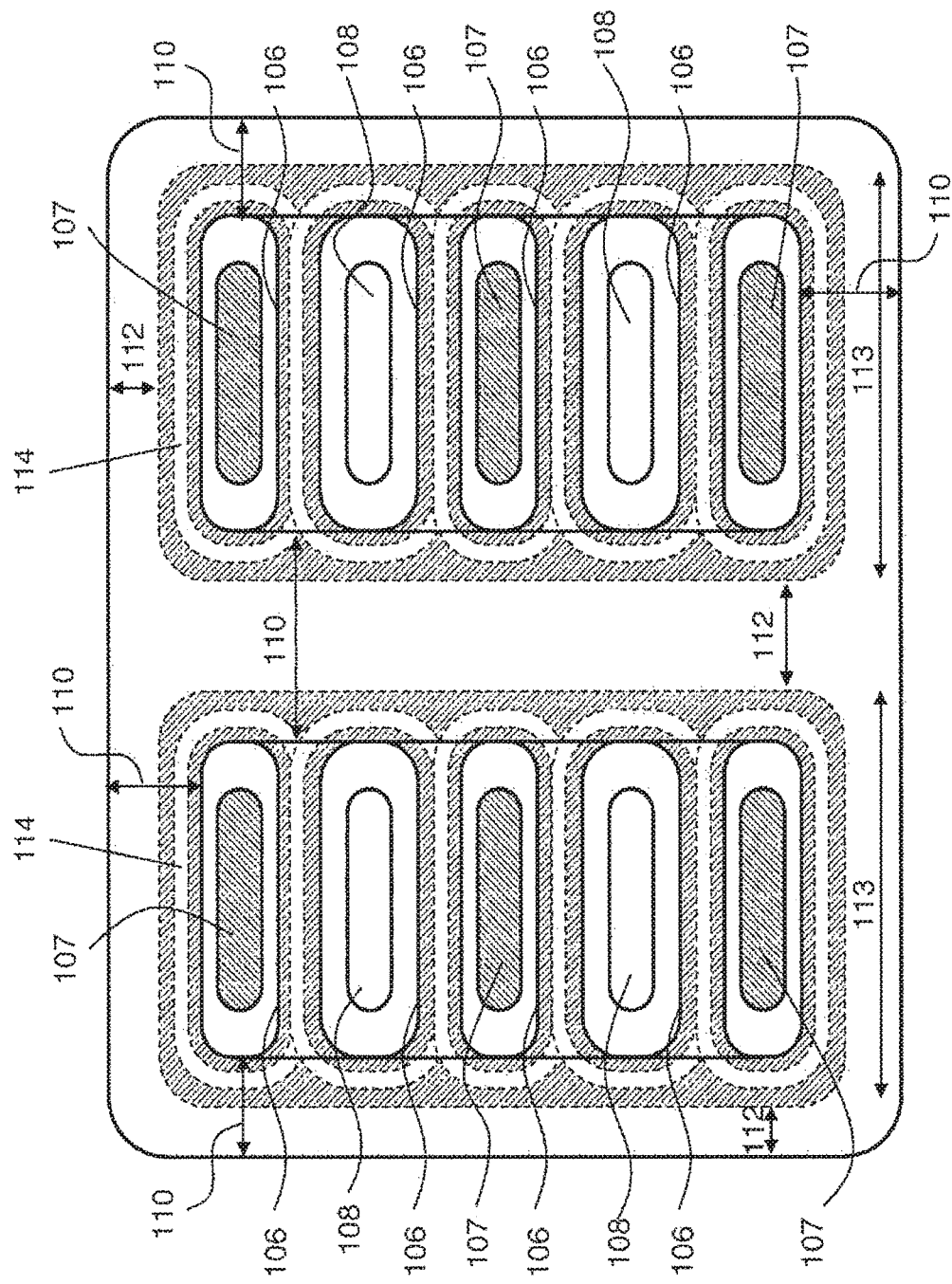
FIG. 25 is a plan view of a nitride semiconductor device according to Modification 4-4 in the fourth exemplary embodiment of the present invention.

A nitride semiconductor device according to the present modification is obtained by rounding an end of each of gate electrode 106, source electrode 107, drain electrode 108 and gate recess region 114 in the nitride semiconductor device shown in the plan view of FIG. 24, and a plan view of the nitride semiconductor device according to the present modification is shown in FIG. 25. Compositions and layer thicknesses of substrate 101 and layers up to and including undoped AlGaN layer 104, metal compositions, lengths and widths of gate electrode 106, source electrode 107, drain electrode 108, wiring layer 110 and electrode pad 119, and a width of gate recess region 114 are the same as in Example 3-1. The end of each of gate electrode 106, source electrode 107 and drain electrode 108 is formed in an arc shape. Consequently, electric filed concentration can be suppressed. A sectional view of this nitride semiconductor device is the same as FIG. 19.

This configuration makes it possible to efficiently integrate a transistor while reducing a gate resistance.

Modification 4-5

Figure 26:
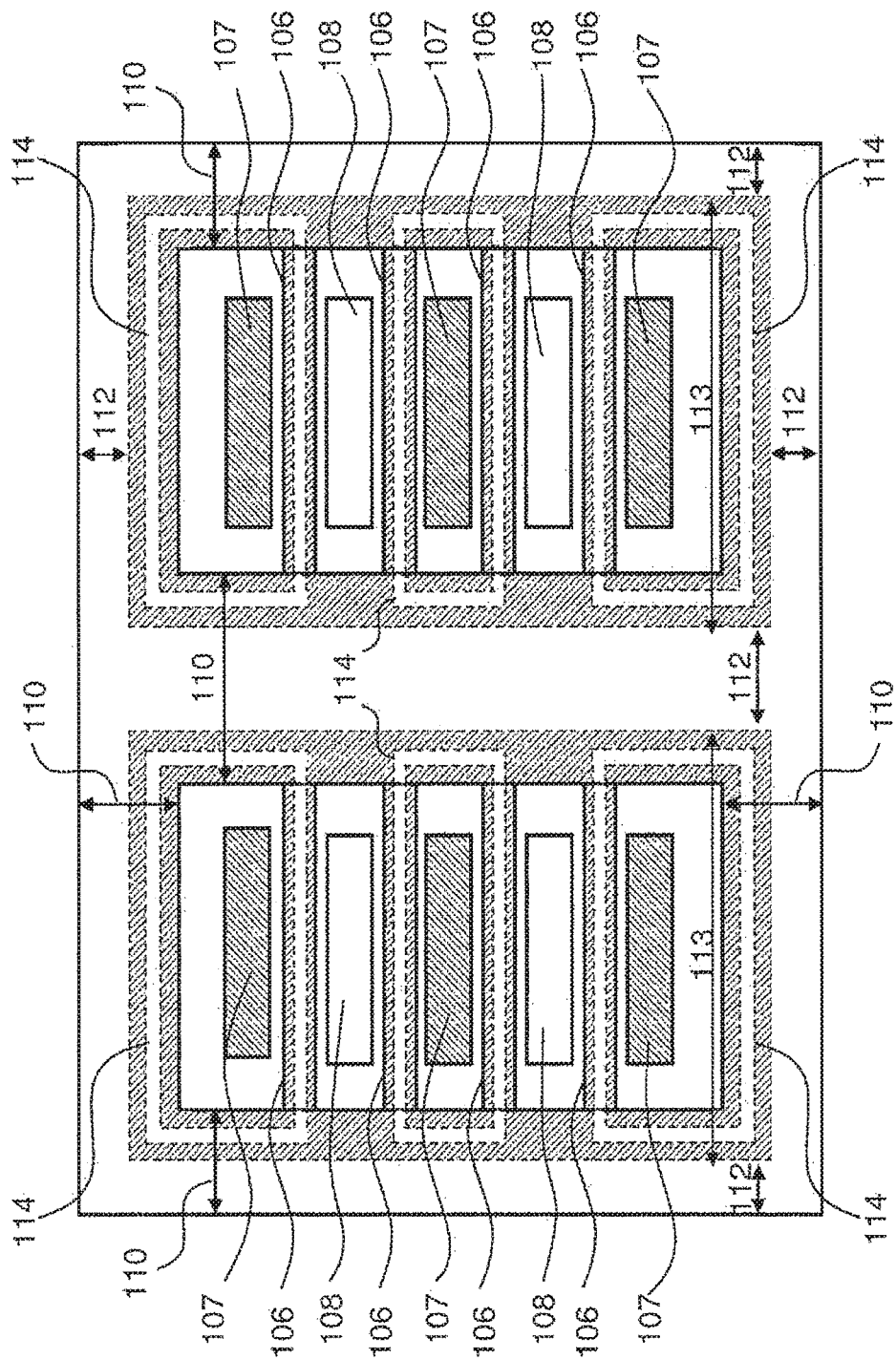
FIG. 26 is a plan view of a nitride semiconductor device according to Modification 4-5 in the fourth exemplary embodiment of the present invention.

As shown in FIG. 26, a nitride semiconductor device according to the present modification is different from that according to Modification 4-3 in that gate recess region 114 of undoped AlGaN layer 104 is formed so as to surround only a periphery of source electrode 107. In this configuration, the same effect as in Modification 4-4 can be obtained.

In the present modification, an example has been shown in which source electrode 107 is surrounded by gate recess region 114, but drain electrode 108 may be surrounded thereby. It is also possible to form a Schottky gate, a p-type semiconductor layer and an insulating gate for the gate.

Modification 4-6

Figure 27:
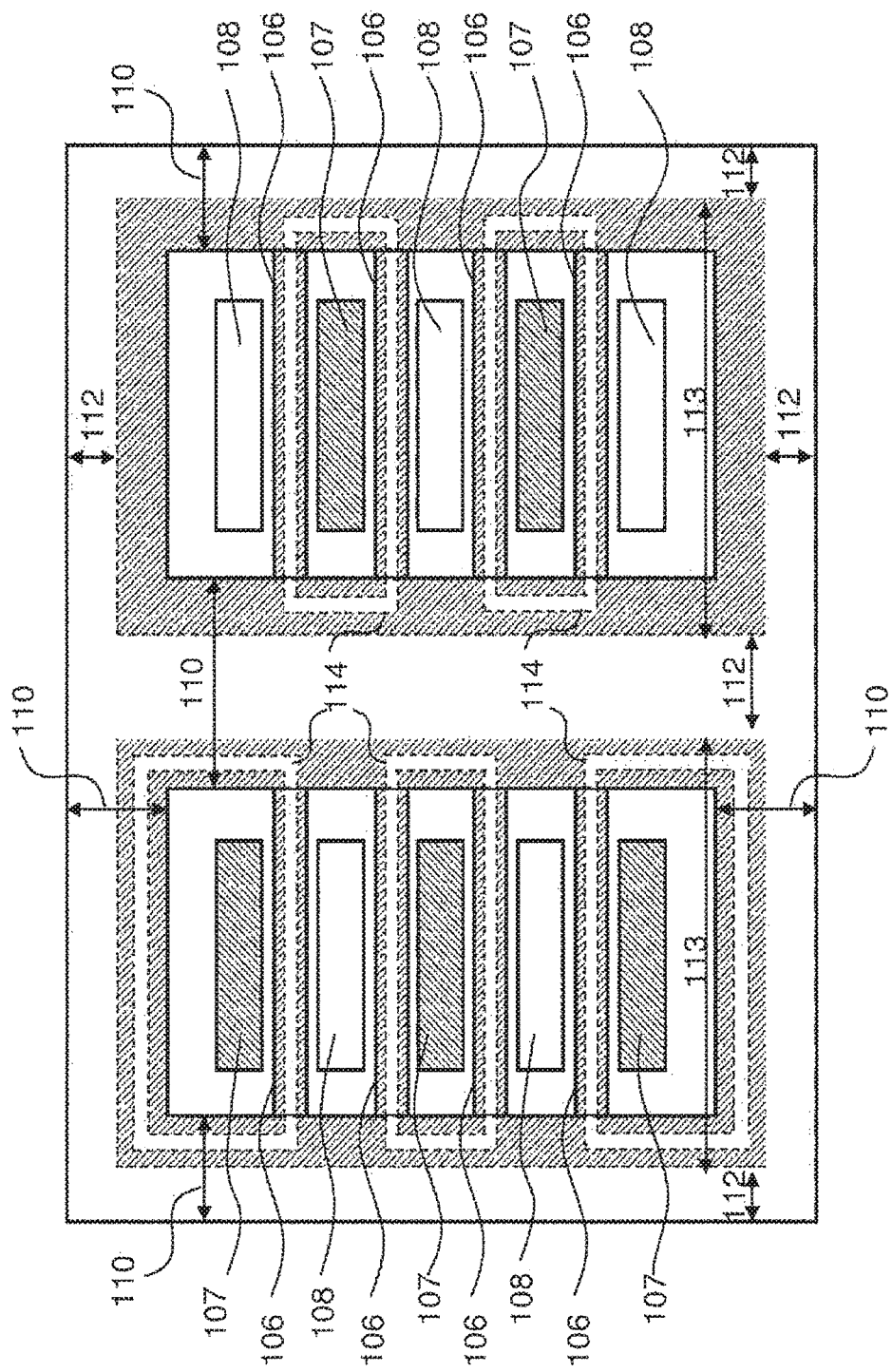
FIG. 27 is a plan view of a nitride semiconductor device according to Modification 4-6 in the fourth exemplary embodiment of the present invention.

As shown in FIG. 27, a nitride semiconductor device according to the present modification is different from that according to Modification 4-5 in that source electrode 107 and drain electrode 108 face each other with gate wire 110 held therebetween. That is, in FIG. 27, arrangements of source electrode 107 and drain electrode 108 are different on left and right sides of gate wire 110 at the center in the drawing. In this configuration, the same effect as in Modification 4-5 can be obtained.

In the present modification, an example has been shown in which source electrode 107 is surrounded by gate recess region 114, but drain electrode 108 may be surrounded thereby. It is also possible to form a Schottky gate, a p-type semiconductor layer and an insulating gate for the gate.

In the fourth exemplary embodiment, ion implantation using not only Ar ions but also other ions, for example, boron ions and nitrogen ions can be performed for formation of high resistance region 112. High resistance region 112 may be formed by etching, and when undoped AlGaN layer 104 is removed, a two-dimensional electron gas disappears, so that high resistance region 112 can be formed.

High resistance region 112 may be formed by selectively thermally oxidizing undoped AGaN layer 104 and undoped GaN layer 103.

Fifth Exemplary Embodiment

Figure 28:
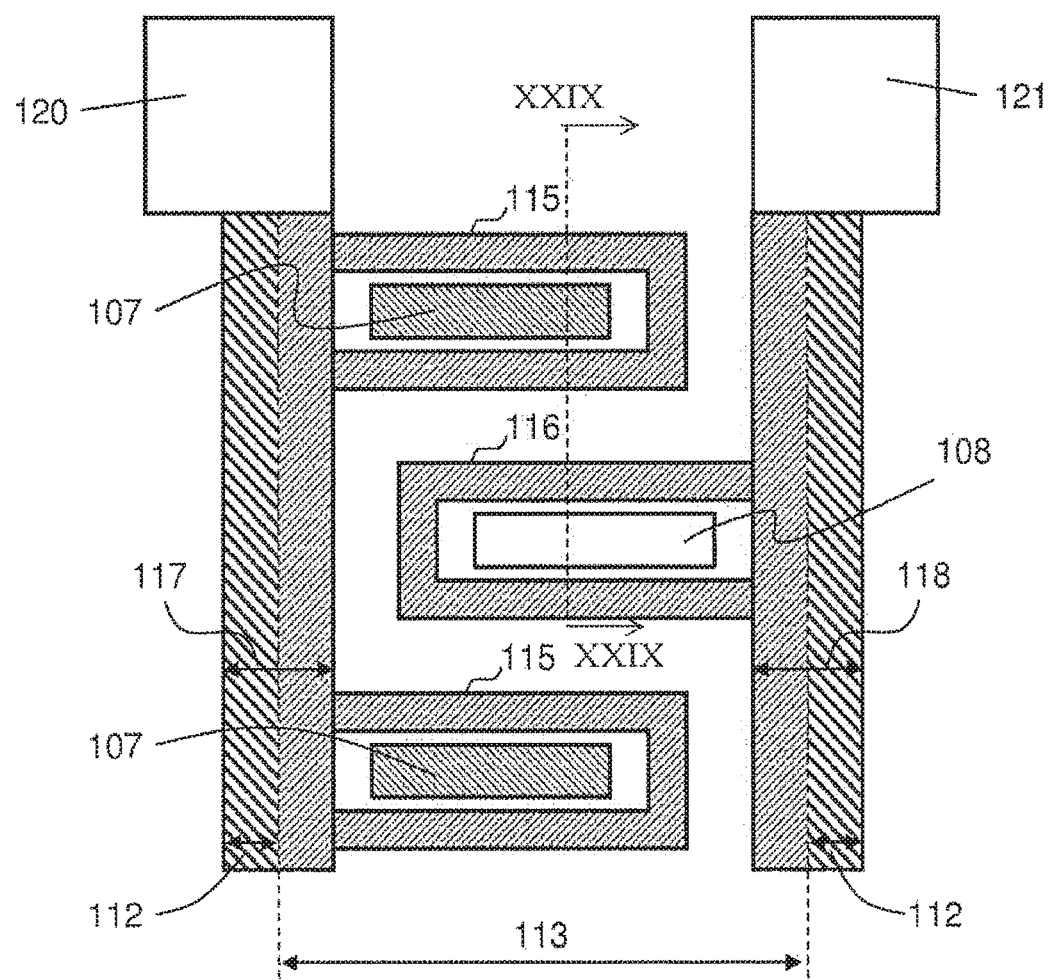
FIG. 28 is a plan view of a nitride semiconductor device according to a fifth exemplary embodiment of the present invention.

As shown in FIG. 28, in a nitride semiconductor device according to the present exemplary embodiment, first gate electrode 115 is formed so as to surround source electrode 107, and electrically connected to first gate wire 117. Second gate electrode 116 is formed so as to surround drain electrode 108, and electrically connected to second gate wire 118. First gate electrode 115 and second gate electrode 116 can be independently controlled.

First gate wire 117 is connected to first electrode pad 120, and second gate wire 118 is connected to second electrode pad 121. Widths of first gate wire 117 and second gate wire 118 are both 40 μm, and first electrode pad 120 and second electrode pad 121 are each a square with a length of 100 μm on each side.

An arrangement relationship between first gate wire 117 and second gate wire 118, and high resistance region 112 formed at an inside thereof is such that high resistance region 112 is at a distance of 2 μm from an end of first gate wire 117 and second gate wire 118 on the first gate electrode 115 side or the second gate electrode 116 side.

Figure 29:
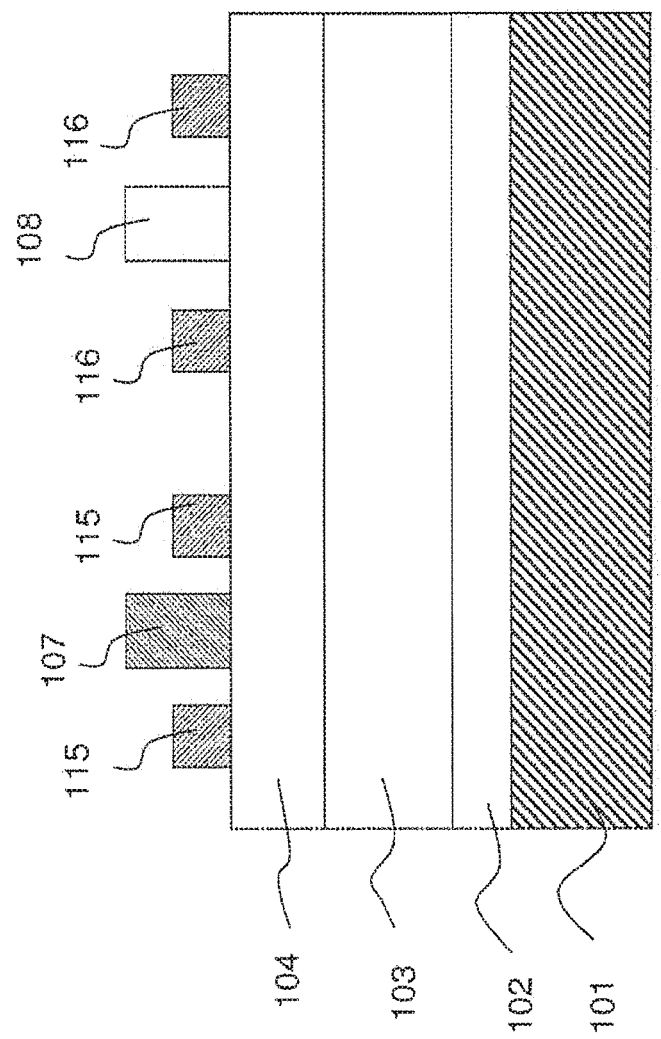
FIG. 29 is a sectional view along line XXIX-XXIX shown in FIG. 28 of the nitride semiconductor device according to the fifth exemplary embodiment of the present invention.

In FIG. 28, a sectional view along line XXIX-XXIX is shown in FIG. 29. The nitride semiconductor device of FIG. 29 is configured such that, for example, 100 nm-thick buffer layer 102 made of AlN, 2 μm-thick undoped GaN layer 103, and 20 nm-thick undoped AlGaN layer 104 having an Al composition ratio of 20% are epitaxially grown in this order on, for example, 600 μm-thick substrate 101 made of silicon, and for example, source electrode 107 having a laminated structure of Ti and Al and drain electrode 108 having a laminated structure of Ti and Al are formed so as to be in ohmic contact with undoped AlGaN layer 104. On undoped AlGaN layer 104, first gate electrode 115 is formed so as to surround source electrode 107, and second gate electrode 116 is formed so as to surround drain electrode 108. That is, first gate electrode 115 and second gate electrode 116 are formed between source electrode 107 and drain electrode 108. First gate electrode 115 and second gate electrode 116 are made of, for example, Ni, and are in Schottky contact with undoped AlGaN layer 104. First gate wire 117 and second gate wire 118 are made of, for example, Au, and are in Schottky contact with undoped AlGaN layer 104. First gate electrode 115, second gate electrode 116, first gate wire 117 and second gate wire 118 may be made of the same electrode material, or may be formed at the same time. For example, first gate electrode 115, second gate electrode 116, first gate wire 117 and second gate wire 118 may be formed using Ni as the electrode material by vapor deposition, sputtering or the like while photolithography is performed at the same time. That is, the nitride semiconductor device of FIG. 29 is a so-called double gate type FET.

This configuration makes it possible to reduce parasitic capacitances of first gate wire 117 and second gate wire 118, so that high-speed two-way switching operation can be performed.

In the fifth exemplary embodiment, it is also possible to form a Schottky gate, a p-type semiconductor layer and an insulating gate for the gate. High resistance region 112 may be formed not only by ion implantation but also by etching, and when undoped AlGaN layer 104 is removed, a two-dimensional electron gas disappears, so that high resistance region 112 can be formed.

Modification 5-1

Figure 30:
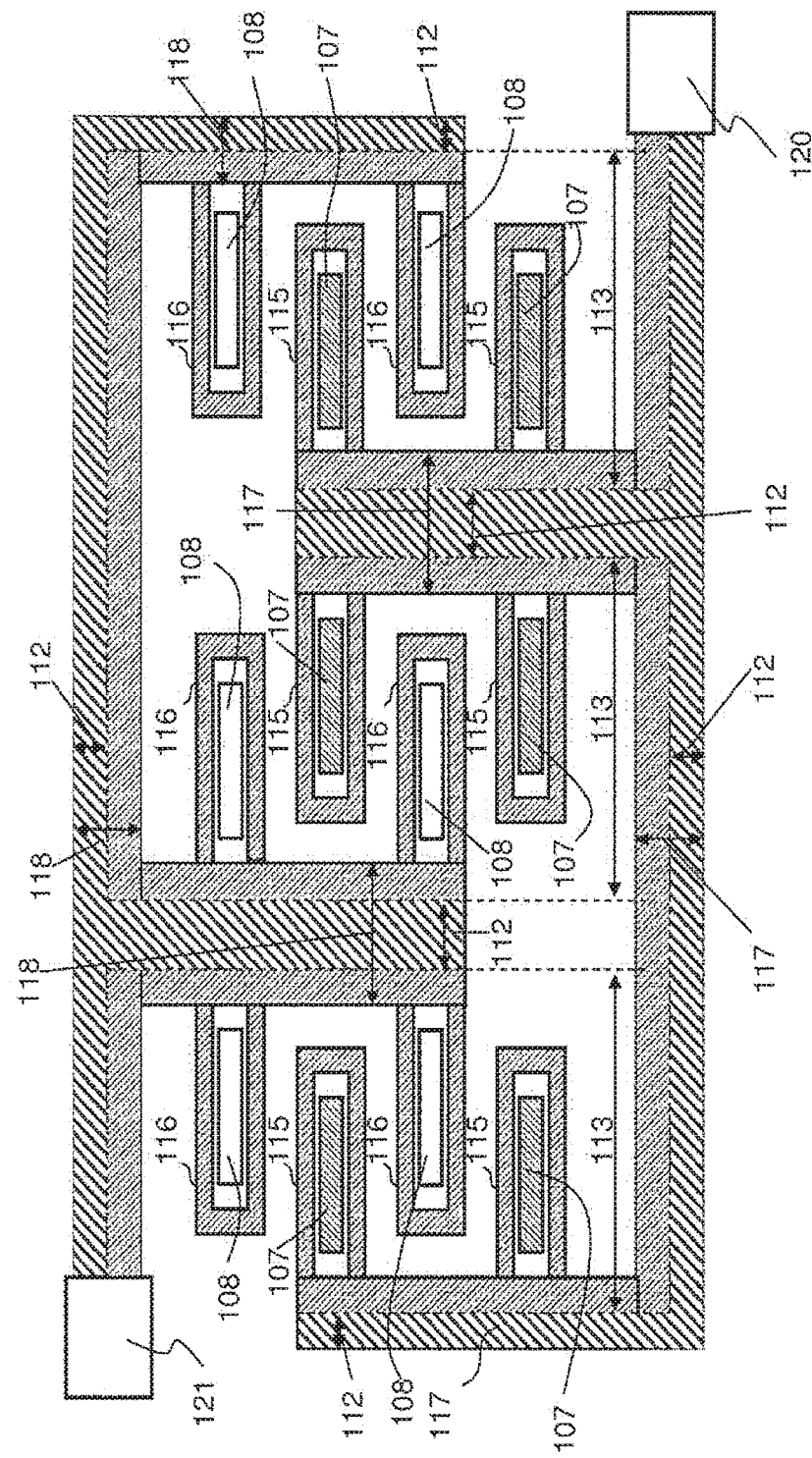
FIG. 30 is a plan view of a nitride semiconductor device according to Modification 5-1 in the fifth exemplary embodiment of the present invention.

A nitride semiconductor device according to Modification 5-1 as shown in FIG. 30 is obtained by modifying the nitride semiconductor device of FIG. 28 in the following manner. That is, in the nitride semiconductor device according to Modification 5-1, a plurality of first gate wires 117 are branched from first electrode pad 120, a plurality of second gate wires 118 are branched from second electrode pad 121, and the respective wires are alternately disposed. Further, first gate electrode 115 and second gate electrode 116 are disposed between source electrode 107 and drain electrode 108. First gate electrode 115 is formed so as to surround source electrode 107, and second gate electrode 116 is formed so as to surround drain electrode 108. First gate electrode 115 and second gate electrode 116 can be independently controlled.

This configuration makes it possible to reduce parasitic capacitances of first gate wire 117 and second gate wire 118, so that high-speed two-way switching operation can be performed.

In the fifth exemplary embodiment including Modification 5-1, it is also possible to form a Schottky gate, a p-type semiconductor layer and an insulating gate for the gate.

In the fifth exemplary embodiment, ion implantation using not only Ar ions but also other ions, for example, boron ions and nitrogen ions can be performed for formation of high resistance region 112. High resistance region 112 may be formed by etching, and when undoped AlGaN layer 104 is removed, a two-dimensional electron gas disappears, so that high resistance region 112 can be formed. High resistance region 112 may be formed by selectively thermally oxidizing undoped AlGaN layer 104 and undoped GaN layer 103.

Sixth Exemplary Embodiment

Figure 31:
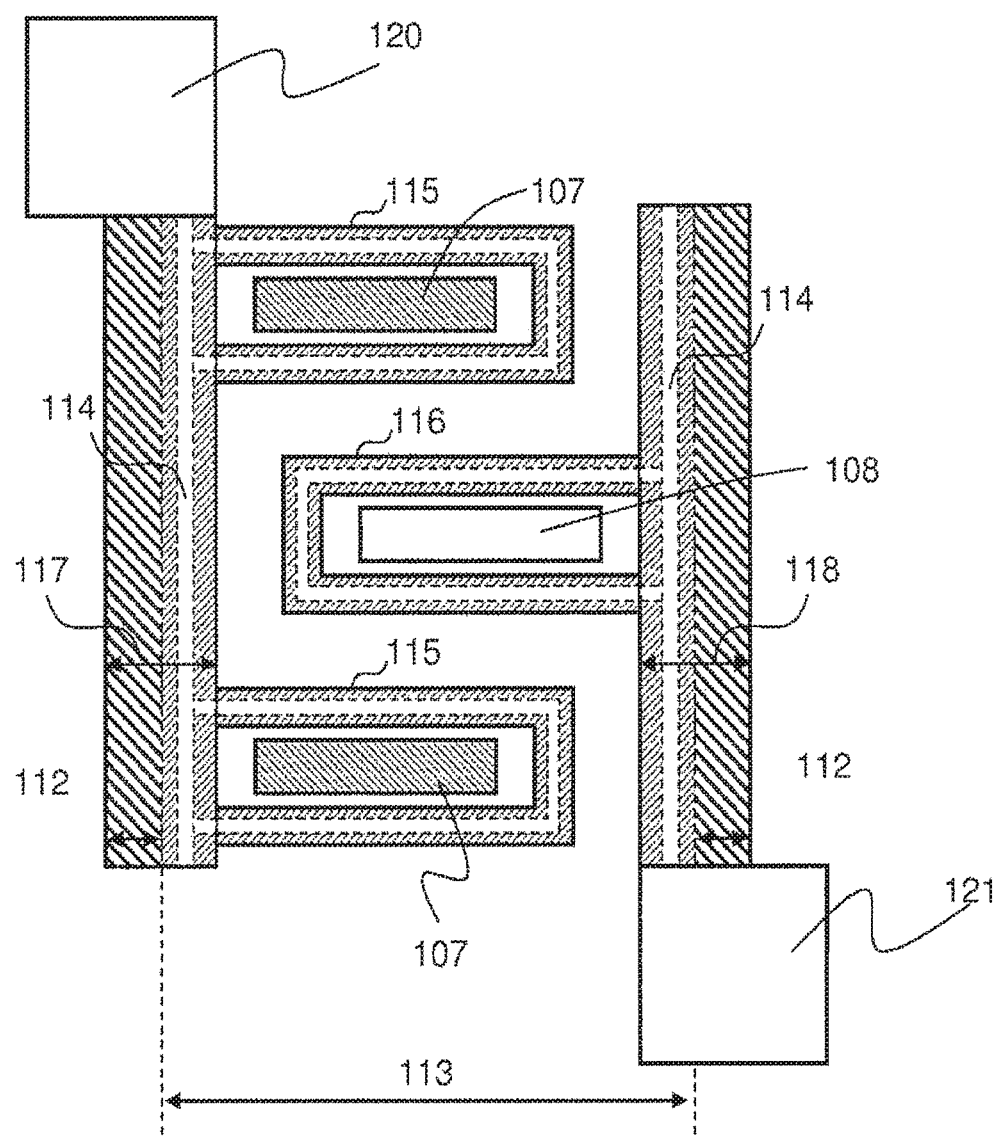
FIG. 31 is a plan view of a nitride semiconductor device according to a sixth exemplary embodiment of the present invention.

As shown in FIG. 31, in a nitride semiconductor device according to the present exemplary embodiment, first gate electrode 115 is formed so as to surround source electrode 107, and electrically connected to first gate wire 117. Second gate electrode 116 is formed so as to surround drain electrode 108, and electrically connected to second gate wire 118. First gate electrode 115 and second gate electrode 116 can be independently controlled. Further, gate recess region 114 is formed immediately below first gate electrode 115 and second gate electrode 116. In the present exemplary embodiment, as one example, gate recess region 114 is provided only on element region 113 immediately below first gate wire 117 and second gate wire 118. The formation form of gate recess region 114 is not limited thereto, and the foregoing forms can be employed.

An arrangement relationship between first gate wire 117 and second gate wire 118, and high resistance region 112 formed at an inside thereof is such that high resistance region 112 is at a distance of 2 μm from an end of first gate wire 117 and second gate wire 118 on the first gate electrode 115 side or the second gate electrode 116 side.

First gate wire 117 is connected to first electrode pad 120, and second gate wire 118 is connected to second electrode pad 121. Widths of the first gate wire and the second gate wire are both 40 μm, and first electrode pad 120 and second electrode pad 121 are each a square with a length of 100 μm on each side.

This configuration makes it possible to reduce parasitic capacitances of first gate wire 117 and second gate wire 118, so that high-speed two-way switching operation can be performed. Since a threshold voltage of a gate depends on the thickness of undoped AlGaN layer 104 in gate recess region 114, the thickness of the undoped AlGaN layer excluding gate recess region 114 can be increased, so that a decrease in on-resistance and an increase in current can be achieved due to an increase in concentration of a two-dimensional electron gas. Further, when the layer thickness of the undoped AlGaN layer excluding gate recess region 114 is increased, a distance between the surface and the two-dimensional electron gas is longer, so that deterioration of a transient response, such as current collapse, can be suppressed.

In the sixth exemplary embodiment, it is also possible to form a Schottky gate, a p-type semiconductor layer and an insulating gate for the gate.

In the sixth exemplary embodiment, ion implantation using not only Ar ions but also other ions, for example, boron ions and nitrogen ions can be performed for formation of high resistance region 112. High resistance region 112 may be formed by etching, and when undoped AlGaN layer 104 is removed, a two-dimensional electron gas disappears, so that high resistance region 112 can be formed. High resistance region 112 may be formed by selectively thermally oxidizing undoped AlGaN layer 104 and undoped GaN layer 103.

Other Exemplary Embodiments

In the first to sixth exemplary embodiments, substrate 101 is not limited to a silicon substrate, and a sapphire substrate, a SiC substrate, a GaN substrate, a spinel substrate or a hafnium substrate may be used.

In the first to sixth exemplary embodiments, compositions and layer thicknesses of buffer layer 102, undoped GaN layer 103 and undoped AlGaN layer 104, and a composition and a thickness of p-type semiconductor layer 105 are not limited to those described above, and the composition and thickness can be appropriately selected according to desired device characteristics. An impurity concentration of p-type semiconductor layer 105 can also be appropriately selected according to desired device characteristics.

In the first to sixth exemplary embodiments, metal compositions, lengths, widths, thicknesses and sizes of gate electrode 106, source electrode 107, drain electrode 108, wiring layer 110, first gate wire 117, second gate wire 118, electrode pad 119, first electrode pad 120 and second electrode pad 121 are not limited to those described above, and can be appropriately set according to desired device characteristics.

In the first to fourth exemplary embodiments, an arrangement relationship between gate electrode 106 or gate wire 110 and high resistance region 112 formed at an inside thereof is such that high resistance region 112 is at a distance of 2 μm from an end of gate electrode 106 or gate wire 110, but the distance is not limited to this value, and can be appropriately set in a range where good pinch-off characteristics are obtained.

In the fifth exemplary embodiment and the sixth exemplary embodiment, arrangement of first gate wire 117 and second gate wire 118, and high resistance region 112 formed at an inside thereof is such that high resistance region 112 is at a distance of 2 μm from an end of first gate wire 117 and second gate wire 118 on the first gate electrode 115 side or the second gate electrode 116 side, but the distance is not limited to this value, and can be appropriately set in a range where good pinch-off characteristics are obtained.

In the first to sixth exemplary embodiments, the shape of each of electrode pad 119, first electrode pad 120 and second electrode pad 121 is not limited to a square, and an oblong, a rectangle, a regular hexagon, a circle, an ellipse or the like can be selected.

In the first to fourth exemplary embodiments, an inter-electrode distance between source electrode 107 and gate electrode 106 is 1.5 μm, and an inter-electrode distance between gate electrode 106 and drain electrode 108 is 10 μm, but it is needless to say that the inter-electrode distances are not limited to these values. In the fifth exemplary embodiment and the sixth exemplary embodiment, intervals of source electrode 107, first gate electrode 115, the second gate electrode and drain electrode 108 can be appropriately set according to desired device characteristics.

In the first exemplary embodiment, pad-on-element mounting is employed, but mounting is not limited to pad-on-element mounting. The same applies in mounting methods that are employed for semiconductor devices according to other exemplary embodiments.

Figure 32:
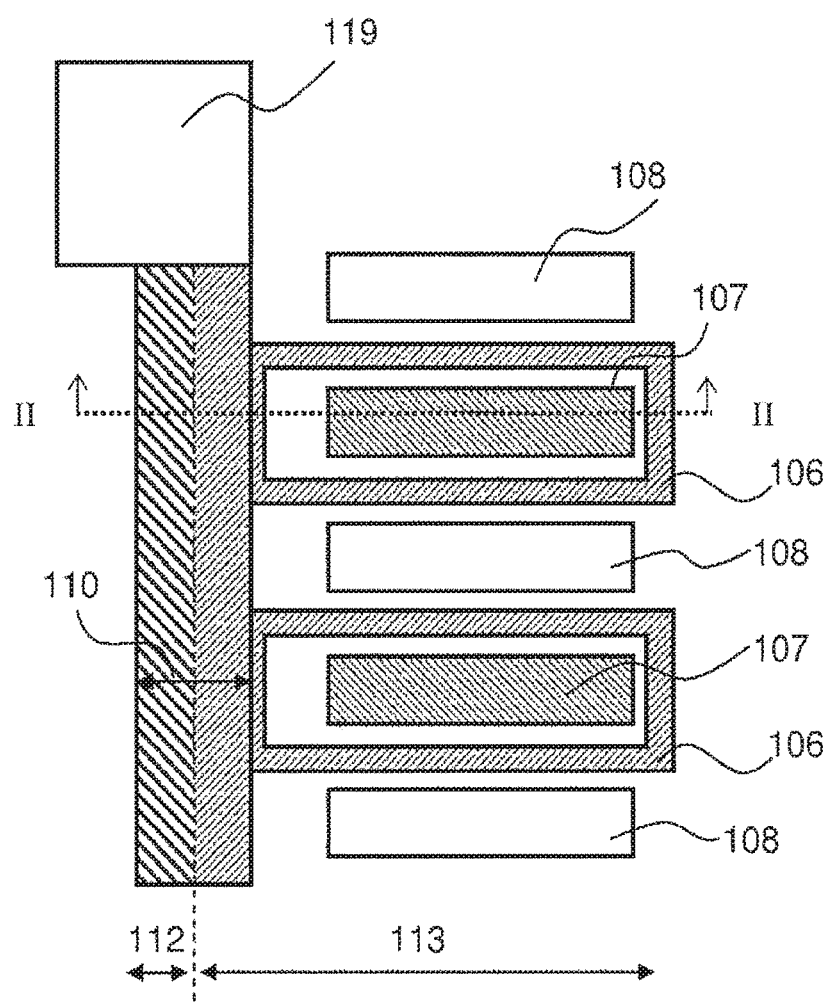
FIG. 32 is a plan view of a nitride semiconductor device according to another exemplary embodiment of the present invention.

In the first exemplary embodiment, source electrode 107 may be surrounded by gate electrode 106, and gate electrode 106 may be connected to gate wire layer 110 as shown in FIG. 32. A sectional view along dashed line II-II in FIG. 32 of this nitride semiconductor device is the same as FIG. 2. By so doing, pinch-off characteristics of the semiconductor device can be improved. Drain electrode 108 may be surrounded by gate electrode 106. The same applies for the second to sixth exemplary embodiments.

INDUSTRIAL APPLICABILITY

The present invention is useful in a semiconductor device, for example, a transistor to be used in a power supply circuit etc. of consumer equipment.

REFERENCE MARKS IN THE DRAWINGS 101 substrate
102 buffer layer
103 undoped GaN layer
104 undoped AlGaN layer
105 p-type semiconductor layer
106 gate electrode
107 source electrode
108 drain electrode
110 gate wire
111 insulating film
112 high resistance region
113 element region
114 gate recess region
115 first gate electrode
116 second gate electrode
117 first gate wire
118 second gate wire
119 electrode pad
120 first electrode pad
121 second electrode pad

The invention claimed is:

1. A semiconductor device comprising:
a substrate;
a nitride semiconductor layer formed on the substrate, the nitride semiconductor layer including an element region and a high resistance region;
a first source electrode, a first drain electrode and a first gate electrode, each of which is formed on the element region of the nitride semiconductor layer; and
a first gate wire layer formed on the nitride semiconductor layer and connected to the first gate electrode, wherein:
a resistance of the high resistance region is higher than a resistance of the element region,
the first gate electrode includes a first extending portion and a second extending portion, arranged in parallel with each other in a first direction,
the first gate wire layer includes (i) a first portion from which the first and second extending portions of the first gate electrode protrude, and (ii) a second portion which is not in direct contact with the first gate electrode and is disposed adjacent to the first portion, at least one of the first source electrode and the first drain electrode is disposed between the first extending portion and the second extending portion of the first gate electrode in plan view, the first portion overlaps the element region in plan view, the second portion overlaps the high resistance region in plan view, a side surface of the first portion which extends in a second direction crossing the first direction, and no portion of the first gate electrode is disposed at the first direction between the side surface of the first portion and at least one of the first source electrode and the first drain electrode in plan view.

2. The semiconductor device according to claim 1, wherein the at least one of the first source electrode and the first drain electrode is surrounded by the first and second extending portions of the first gate electrode and a part of a side surface of the first gate wire layer in plan view.

3. The semiconductor device according to claim 1, further comprising a second source electrode, a second drain electrode and a second gate electrode, each of which is formed on the element region of the nitride semiconductor layer, wherein:

the second gate electrode includes a third extending portion and a fourth extending portion, arranged in parallel with each other, the third extending portion and the fourth extending portion protrude from the first portion of the first gate wire layer, and at least one of the second source electrode and the second drain electrode is disposed between the third extending portion and the fourth extending portion of the second gate electrode in plan view.

4. The semiconductor device according to claim 3, wherein the first source electrode, the first drain electrode, the second source electrode and the second drain electrode are disposed in this order in plan view.

5. The semiconductor device according to claim 1, further comprising a second gate wire layer, wherein the first source electrode, the first drain electrode and the first gate electrode are disposed between the first gate wire layer and the second gate wire layer in plan view.

6. The semiconductor device according to claim 1, further comprising:

a second source electrode, a second drain electrode and a second gate electrode, each of which is formed on the element region of the nitride semiconductor layer, wherein:

the second gate electrode includes a third extending portion and a fourth extending portion arranged in parallel with each other, the first gate wiring layer further includes a third portion and from which the third and fourth extending portions of the second gate electrode protrude, the third portion being arranged such that the second portion is disposed between the first portion and the third portion, and at least one of the second source electrode and the second drain electrode is disposed between the third extending portion and the fourth extending portion of the second gate electrode in plan view.

7. The semiconductor device according to claim 1, further comprising a pad formed on the nitride semiconductor layer, wherein the first gate wire layer is connected to the pad.

8. The semiconductor device according to claim 1, further comprising:

a second gate electrode and a second gate wire layer, wherein:

the second gate electrode includes a third extending portion and a fourth extending portion arranged in parallel with each other, the second gate wire layer includes a third portion from which the third and fourth extending portions of the second gate electrode protrude, and a fourth portion which is not in direct contact with the second gate electrode and is disposed adjacent to the third portion, the second gate wire layer is arranged in parallel with the first gate wire layer, the first source electrode is disposed between the first extending portion and the second extending portion of the first gate electrode, and the first drain electrode is disposed between the third extending portion and the fourth extending portion of the second gate electrode.

9. The semiconductor device according to claim 8, wherein:

the first source electrode is surrounded by the first and second extending portions of the first gate electrode and a part of a side surface of the first gate wire layer in plan view, and the first drain electrode is surrounded by the third and fourth extending portions of the second gate electrode and a part of a side surface of the second gate wire layer in plan view.

10. The semiconductor device according to claim 9, wherein:

the first and second gate wire layers face each other with the first source electrode and the first drain electrode disposed therebetween in plan view, a plurality of source electrodes each being the first source electrode and a plurality of drain electrodes each being the first drain electrode are provided, and each of the plurality of source electrodes and each of the plurality of drain electrodes are alternately disposed in plan view.

11. The semiconductor device according to claim 1, wherein a semiconductor layer including a p-type impurity is formed between the first gate electrode, the first gate wire layer and the nitride semiconductor layer.

12. The semiconductor device according to claim 11, wherein:

the semiconductor layer including the p-type impurity is formed immediately below the first gate electrode and immediately below the first gate wire layer and in a vicinity of the high resistance region, and the first gate electrode and the first gate wire layer cover the semiconductor layer including the p-type impurity.

13. The semiconductor device according to claim 1, wherein an insulating layer is formed between the first gate electrode and the first gate wire layer, and the nitride semiconductor layer.

14. The semiconductor device according to claim 1, wherein the high resistance region is formed by ion implantation to the nitride semiconductor layer.

15. The semiconductor device according to claim 1, wherein the nitride semiconductor layer includes two layers that have different compositions and are in contact with each other, and the high resistance region is formed by etching until reaching an interface between the two layers.

16. The semiconductor device according to claim 1, wherein a width of the first portion is smaller than a width of the second portion.

17. The semiconductor device according to claim 1, wherein a two-dimensional electron gas is formed in the element region, and no two-dimensional electron gas is formed in the high resistance region.

18. The semiconductor device according to claim 1, wherein one of the first source electrode and the first drain electrode is surrounded by the first and second extending portions of the first gate electrode and a part of a side surface of the first gate wire layer in plan view, and another of the first source electrode and the first drain electrode is not surrounded by the first and second extending portions of the first gate electrode and a part of a side surface of the first gate wire layer in plan view.

19. A semiconductor device comprising:
a substrate;
a nitride semiconductor layer formed on the substrate, the nitride semiconductor layer including an element region and a high resistance region, the element region including an undoped AlGaN layer and an undoped GaN layer;
a first source electrode, a first drain electrode and a first gate electrode, each of which is formed on the element region of the nitride semiconductor layer; and
a first gate wire layer formed on the nitride semiconductor layer and connected to the first gate electrode, wherein:
a resistance of the high resistance region is higher than a resistance of the element region,
the first gate electrode includes a first extending portion and a second extending portion, arranged in parallel with each other,
the first gate wire layer includes (i) a first portion from which the first and second extending portions of the first gate electrode protrude, and (ii) a second portion which is not in direct contact with the first gate electrode and is disposed adjacent to the first portion,
at least one of the first source electrode and the first drain electrode is disposed between the first extending portion and the second extending portion of the first gate electrode in plan view, and
the first portion overlaps the undoped AlGaN layer and the undoped GaN layer in the thickness direction of the substrate in a cross-sectional view which includes the first gate wire layer and at least one of the first source electrode and the first drain electrode.

20. The semiconductor device according to claim 19, wherein
the at least one of the first source electrode and the first drain electrode is surrounded by the first and second extending portions of the first gate electrode and a part of a side surface of the first gate wire layer in plan view.

21. The semiconductor device according to claim 19, wherein
the high resistance region is formed by ion implantation to the nitride semiconductor layer.

22. The semiconductor device according to claim 19, wherein
a bottom end of the high resistance region is formed in the undoped GaN layer.

23. The semiconductor device according to claim 19, wherein
the high resistance region is in contact with the second portion directly.

24. The semiconductor device according to claim 19, wherein
the high resistance region is a shape of a rectangle in a cross sectional view.

25. The semiconductor device according to claim 19, wherein
the first extending portion extends along a first direction, and
a width of the first portion along the first direction is narrower than a width of the second portion along the first direction.

26. The semiconductor device according to claim 19, wherein
a two-dimensional electron gas is formed between the undoped AlGaN layer and the undoped GaN layer.

27. A semiconductor device comprising:
a substrate;
a nitride semiconductor layer formed on the substrate, the nitride semiconductor layer including an element region and a high resistance region;
a first source electrode, a first drain electrode and a first gate electrode, each of which is formed on the element region of the nitride semiconductor layer; and
a first gate wire layer formed on the nitride semiconductor layer and connected to the first gate electrode, wherein:
a resistance of the high resistance region is higher than a resistance of the element region,
the first gate electrode includes a first extending portion and a second extending portion, the first extending portion is electrically coupled to the second extending portion via a third extending portion and arranged in parallel with each other, wherein the first, second, and third extending portions and the first gate wire layer completely surround the first source electrode in plan view,
the first gate wire layer includes (i) a first portion from which the first and second extending portions of the first gate electrode protrude, and (ii) a second portion which is not in direct contact with the first gate electrode and is disposed adjacent to the first portion, and
the first portion is disposed between the second portion and at least one of the first source electrode and the first drain electrode in plan view.

28. The semiconductor device according to claim 27, wherein
the at least one of the first source electrode and the first drain electrode is surrounded by the first and second extending portions of the first gate electrode and a part of a side surface of the first gate wire layer in plan view.

29. The semiconductor device according to claim 27, wherein
the high resistance region is formed by ion implantation to the nitride semiconductor layer.

30. The semiconductor device according to claim 27, wherein
the high resistance region is in contact with the second portion directly.

31. The semiconductor device according to claim 27, wherein
the high resistance region is a shape of a rectangle in a cross sectional view.

32. The semiconductor device according to claim 27, wherein
the first extending portion extends along a first direction, and
a width of the first portion along the first direction is narrower than a width of the second portion along the first direction.

* * * * *